(12) United States Patent
Hida et al.

(10) Patent No.: US 8,640,013 B2
(45) Date of Patent: Jan. 28, 2014

(54) STORAGE DEVICE

(75) Inventors: Toshikatsu Hida, Kanagawa (JP); Shinichi Kanno, Tokyo (JP); Osamu Torii, Tokyo (JP); Koji Horisaki, Kanagawa (JP); Dong Zhang, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/601,707

(22) Filed: Aug. 31, 2012

(65) Prior Publication Data

US 2013/0080863 A1    Mar. 28, 2013

(30) Foreign Application Priority Data

Sep. 22, 2011 (JP) ................... 2011-208038
Mar. 23, 2012 (JP) ................... 2012-06964
Mar. 23, 2012 (JP) ................... 2012-067056
Mar. 23, 2012 (JP) ................... 2012-067276

(51) Int. Cl.
*H03M 13/15*    (2006.01)

(52) U.S. Cl.
USPC ............................................. 714/784

(58) Field of Classification Search
USPC ............................................. 714/784
See application file for complete search history.

(56) References Cited

U.S. PATENT DOCUMENTS

| | | | |
|---|---|---|---|
| 5,666,369 A | 9/1997 | Nakamura | |
| 8,069,394 B2 | 11/2011 | Kanno et al. | |
| 8,117,517 B2 | 2/2012 | Kanno et al. | |
| 8,187,322 B2 | 5/2012 | Smith | |
| 8,196,008 B2 | 6/2012 | Kanno et al. | |
| 2002/0014980 A1* | 2/2002 | Rub et al. ......................... 341/59 |
| 2003/0106014 A1* | 6/2003 | Dohmen et al. .............. 714/785 |
| 2008/0104459 A1* | 5/2008 | Uchikawa et al. ............ 714/721 |
| 2009/0070656 A1* | 3/2009 | Jo et al. ........................ 714/763 |
| 2009/0106634 A1* | 4/2009 | Muraoka ....................... 714/785 |
| 2009/0222708 A1* | 9/2009 | Yamaga ........................ 714/773 |
| 2010/0223531 A1 | 9/2010 | Fukutomi et al. | |
| 2011/0047441 A1 | 2/2011 | Yamaga | |
| 2011/0202812 A1 | 8/2011 | Asano et al. | |
| 2011/0214033 A1 | 9/2011 | Yoshii et al. | |
| 2011/0231738 A1 | 9/2011 | Horisaki | |
| 2011/0239081 A1 | 9/2011 | Hida et al. | |
| 2011/0239083 A1 | 9/2011 | Kanno | |
| 2011/0239092 A1 | 9/2011 | Horisaki | |
| 2012/0072811 A1 | 3/2012 | Fukutomi et al. | |
| 2012/0173954 A1* | 7/2012 | Yamagishi ................... 714/760 |
| 2012/0221918 A1 | 8/2012 | Kanno et al. | |

FOREIGN PATENT DOCUMENTS

| | | |
|---|---|---|
| JP | 2009-212623 | 9/2009 |
| WO | WO 2012/081732 A1 | 6/2012 |
| WO | WO 2012/081733 A1 | 6/2012 |

* cited by examiner

*Primary Examiner* — Ajay Bhatia
*Assistant Examiner* — Thien D Nguyen
(74) *Attorney, Agent, or Firm* — Oblon, Spivak, McClelland, Maier & Neustadt, L.L.P.

(57) ABSTRACT

According to one embodiment, a storage device performs error correction processing of a code of which the maximum correction performance is T bits, the decoding device including an error correction processor for performing error correction processing using calculating devices capable of handling errors of J bits (J is an integer equal to or more than one and less than T), wherein an initial value of an error number expectation value is set to I (I is an integer equal to or more than one and less than T), and execution of increment of the error number expectation value and execution of the error correction processing is repeated until no error is detected or the error number expectation value becomes T bits.

20 Claims, 29 Drawing Sheets

FIG.42

| INPUT OF 0 | OUTPUT BIT #0 | OUTPUT BIT #1 | OUTPUT BIT #2 |
|---|---|---|---|
| NIL (INITIAL STATE) | r[0] | r[1] | OUTPUT r[2] |
| INPUT 0 | OUTPUT r[2] | OUTPUT r[0]^r[2] | OUTPUT r[1] |
| INPUT 00 | OUTPUT r[1] | OUTPUT r[2]^r[1] | OUTPUT r[0]^r[2] |
| INPUT 000 | OUTPUT r[0]^r[2] | OUTPUT r[0]^r[2]^r[1] | OUTPUT r[2]^r[1] |

FIG.43

| 1101 | 1000 (UNDERLINE INDICATES DATA BLOCK #3) |
|---|---|
| | 100 (UNDERLINE INDICATES DATA BLOCK #2) |
| | 00 (UNDERLINE INDICATES DATA BLOCK #1) |
| | 1 (UNDERLINE INDICATES DATA BLOCK #0) |

| DATA BLOCK | INFOR-MATION | PARITY #i' | PARITY #i | PARITY P |
|---|---|---|---|---|
| #0 | #1 | Parity 0'={r[2], r[1], r[0]}={0, 1, 1} | Parity 0'={1, 0, 1} | Parity= Parity 0'^ Parity 1'^ Parity 2'^ Parity 3'= {0,0,1} |
| #1 | #1 | Parity 1'={r[2], r[1], r[0]} ={0, 1, 1} | Parity 1'={1, 1, 1} | |
| #2 | #0 | Parity 2'={r[2], r[1], r[0]} ={0, 0, 0} | Parity 2'={0, 0, 0} | |
| #3 | #1 | Parity 3'={r[2], r[1], r[0]} ={0, 1, 1} | Parity 3'={0, 1, 1} | |

STORAGE DEVICE

CROSS-REFERENCE TO RELATED APPLICATIONS

This application is based upon and claims the benefit of priority from Japanese Patent Application No. 2011-208038, filed on Sep. 22, 2011, and Japanese Patent Application No. 2012-067276, Japanese Patent Application No. 2012-067056, and Japanese Patent Application No. 2012-066964, filed on Mar. 23, 2012; the entire contents of all of which are incorporated herein by reference.

FIELD

Embodiments described herein relate generally to a storage device.

BACKGROUND

As the size of a semiconductor memory decreases, a memory system is required to have high degree of error correction performance. In the past, when a decoding device for decoding an error correction code such as BCH code is implemented, circuits corresponding to the maximum number of bits of error correction specified in a system are implemented.

BRIEF DESCRIPTION OF THE DRAWINGS

FIG. 42 is a figure illustrating an example of an intermediate result (parity #i') and an output parity #i;

FIG. 43 is a figure illustrating an example of input information and 0 input;

DETAILED DESCRIPTION

In general, according to an embodiment, a storage device which performs error correction processing on the basis of a code including data, an error detection code, and an error correction code of which maximum correction performance is T bits includes an error correction processing unit (error correction processor). The error correction processing unit performs error correction processing on the basis of the code, using calculating devices capable of supporting an error of J bits (J is an integer equal to or more than one and less than T) in at least some of the error correction processing. When the error correction processing is started, the error number expectation value is set to an initial value I (I is an integer equal to or more than one and less than T). The error correction processing unit is controlled to perform computation that supports the error number expectation value thus set. When the error detector detects no error in the error-corrected data on the basis of the error detection code, the processing is terminated. When the error detector detects an error in the error-corrected data, operation for controlling the error correction processing unit to increase the error number expectation value and to perform computation is repeated until the error detector no longer detects any error or when the error number expectation value becomes T bits.

Exemplary embodiments of storage device will be explained below in detail with reference to the accompanying drawings. The present invention is not limited to the following embodiments.

First Embodiment

Figure 1:
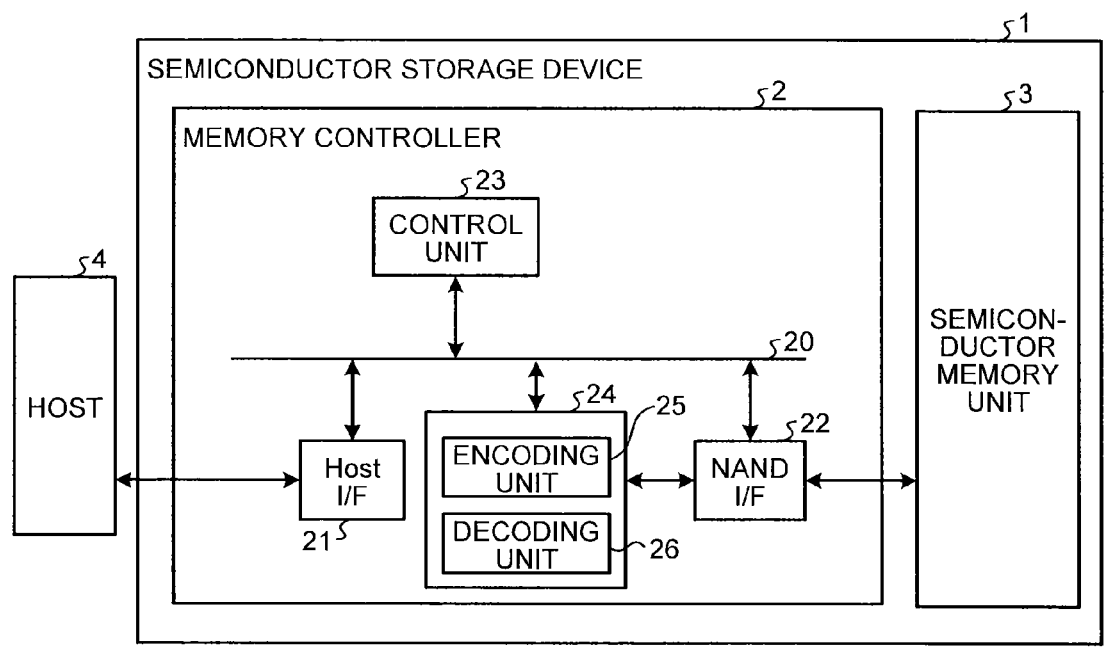
FIG. 1 is a block diagram illustrating an example of configuration of a semiconductor storage device according to a first embodiment.

FIG. 1 is a block diagram illustrating an example of configuration of a semiconductor storage device according to the first embodiment. The semiconductor storage device 1 according to the present embodiment includes a memory controller 2 and a semiconductor memory unit (memory unit, memory module) 3 including a NAND type storage cell. The semiconductor storage device 1 is connected via a communication interface to a host 4, and functions as an external storage medium for the host 4. Examples of hosts 4 include a personal computer, a CPU (Central Processing Unit) core, and the like.

For example, the memory unit 3 is made of a nonvolatile semiconductor memory such as a NAND type flash memory. The memory unit 3 may include a single memory chip, or a plurality of memory chips. When the memory unit 3 includes a plurality of memory chips, the plurality of memory chips may be driven in parallel. On the other hand, each storage cell may be one storing 1 bit (SLC: Single Level Cell), or may be one storing 2 bits or more (MLC: Multi Level Cell). When the memory unit 3 is made of a NAND type flash memory, write and read operations of data in the memory chip are executed in units of pages, and erasing operation of data is executed in units of blocks. The block is a set of multiple pages. Rewriting of data to the same page is permitted only after the entire data in the block including the page is erased.

The memory controller 2 includes an internal bus 20, a host I/F (interface) 21, a NAND I/F (memory control unit, memory control module) 22, a control unit 23, and an encoding/decoding processing unit 24. The encoding/decoding processing unit 24 includes an encoding unit (encoder) 25 and a decoding unit (decoder) 26.

The host I/F 21 outputs, to the internal bus 20, commands, data, and the like received from the host 4. The host I/F 21 transmits to the host 4 data which are input via internal bus 20, a response notification provided by the control unit 23 (such as a notification indicating completion of execution of command), and the like. For example, the host I/F 21 complies communication interface standards such as SATA (Serial Advanced Technology Attachment), SAS (Serial Attached SCSI), and PCI (Peripheral Component Interconnect) Express.

The control unit 23 is a control unit for centrally controlling each constituent element of the semiconductor storage device 1, and includes a CPU core, a RAM (Random Access Memory), a ROM (Read Only Memory), a DMA (Direct Memory Access) controller, and the like. When the control unit 23 receives a command from the host 4 via host I/F 21 and the internal bus 20, the control unit 23 performs control in accordance with the received command. For example, the control unit 23 instructs the NAND I/F 22 to write data to the semiconductor memory unit 3 and read data from the semiconductor memory unit 3 in accordance with the command given by the host 4. The control unit 23 instructs the encoding/decoding processing unit 24 to execute error correction encoding processing or decoding processing.

The encoding/decoding processing unit 24 performs the error correction encoding processing on the data received from the host 4, on the basis of the command of the control unit 23, outputs the processed data to the NAND I/F 22, and performs decoding processing on data which are input from the NAND I/F 22. The NAND I/F 22 reads and writes the semiconductor memory unit 3 on the basis of the command of the control unit 23

The configuration of the semiconductor storage device 1 as illustrated in FIG. 1 is merely an example. As long as the semiconductor storage device 1 includes a semiconductor memory and a controller for controlling reading and writing of the semiconductor memory, and is configured to be able to communicate with the host 4, the semiconductor storage device 1 is not limited to the configuration as illustrated in FIG. 1, and may be configured in any way. Instead of the semiconductor memory unit 3, storage means other than the semiconductor memory may be used.

Subsequently, write operation to the semiconductor memory unit 3 according to the present embodiment will be explained. First, when the control unit 23 is instructed to write data by the host 4, the control unit 23 instructs the encoding/decoding processing unit 24 to execute encoding operation, and also instructs the NAND I/F 22 to write the data to the semiconductor memory unit 3. The data to be written, which has been transmitted from the host 4, are written to a not illustrated buffer memory in the semiconductor storage device 1. The encoding unit 25 of the encoding/decoding processing unit 24 generates an error detection code and an error correction code for the data which are input from the buffer memory, and outputs the generated codes to the NAND I/F 22. The NAND I/F 22 writes the data, which are input from the buffer memory, and the codes generated by the encoding unit 25 to the semiconductor memory unit 3.

Figure 2:
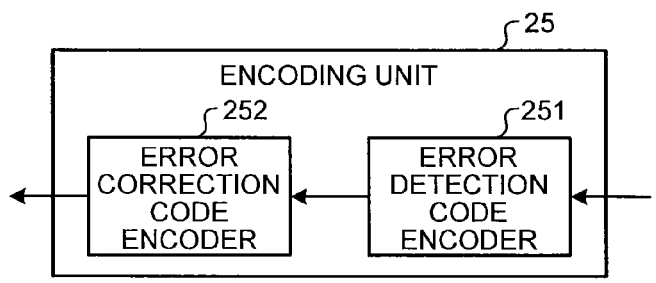
FIG. 2 is a figure illustrating an example of configuration of an encoding unit.

In the present embodiment, the encoding unit 25 generates the error detection code and the error correction code in the encoding processing. FIG. 2 is a figure illustrating an example of configuration of the encoding unit 25 according to the present embodiment. In this case, an example will be explained in which the encoding unit 25 generates a CRC as the error detection code, but the error detection code is not limited to the CRC. As illustrated in FIG. 2, the encoding unit 25 includes an error detection code encoder (error detection encoding unit) 251 generating a CRC (Cyclic Redundancy Check) on the basis of write data of a predetermined size and an error correction code encoder 252 generating an error correction code on the basis of the write data of the predetermined size and the CRC corresponding to the data. Any code may be used as the error correction code. For example, a BCH code, an RS (Reed-Solomon) code, and the like can be used. Hereinafter, the BCH code will be explained as an example.

Figure 3:
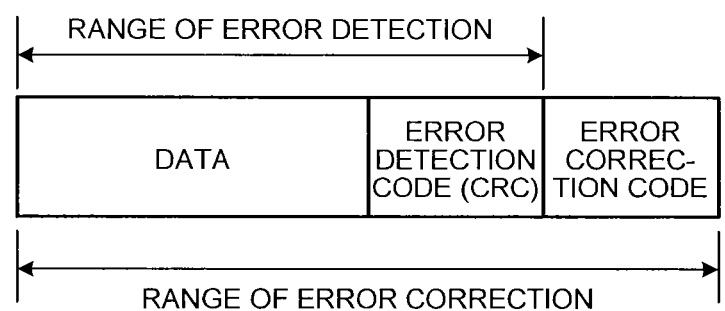
FIG. 3 is a figure illustrating relationship between a code and data written to the semiconductor memory unit, and illustrating the concept of a target range of error detection and correction.
Figure 4:
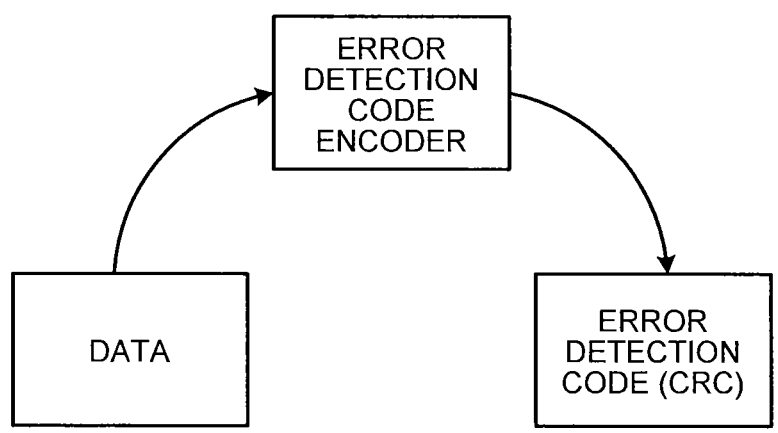
FIG. 4 is a figure illustrating an image of encode/decode of an error detection code and an error correction code.
Figure 5:
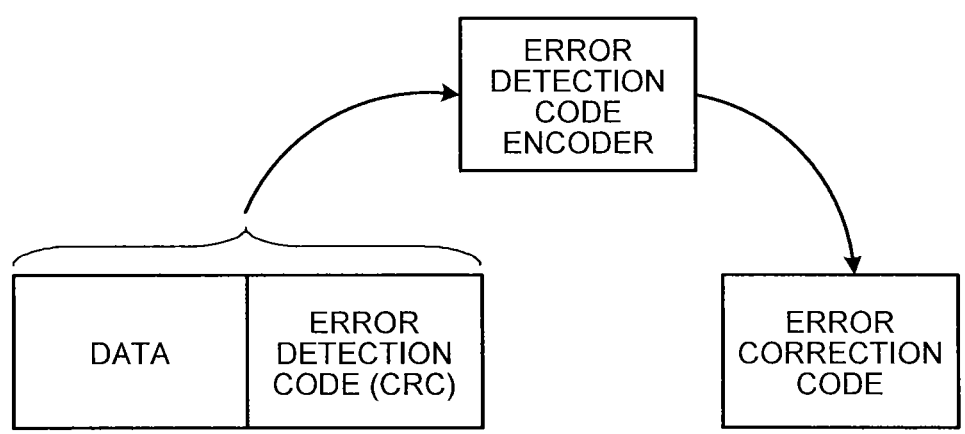
FIG. 5 is a figure illustrating an image of encode/decode of an error detection code and an error correction code.
Figure 6:
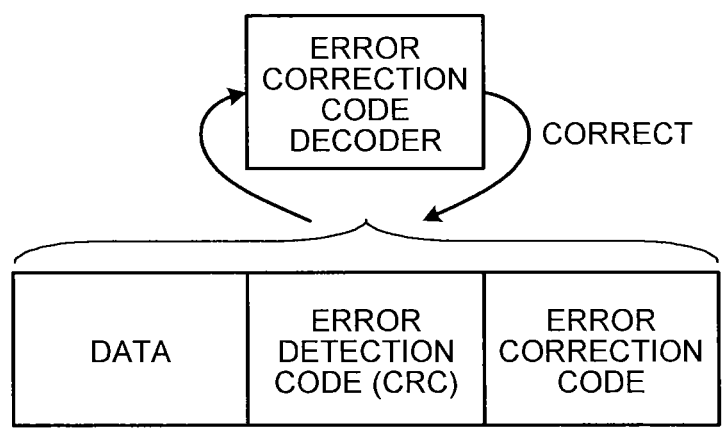
FIG. 6 is a figure illustrating an image of encode/decode of an error detection code and an error correction code.

FIG. 3 is a figure illustrating relationship between a code and data written to the semiconductor memory unit, and illustrating the concept of a target range of error detection and correction. FIGS. 4 to 7 are figures illustrating images of encode/decode of error detection codes and error correction codes. As illustrated in FIG. 4, a CRC is generated on the basis of the write data of the predetermined size (in FIG. 4, denotes as "data"), and as illustrated in FIG. 5, an error correction code is generated while the write data having the predetermined size and the corresponding CRC are adopted as the target of the error correction encoding. As illustrated in FIG. 6, when the error correction processing is performed, the error correction processing is performed using the data generated during the write operation, the CRC corresponding to the data, and the error correction code.

Figure 7:
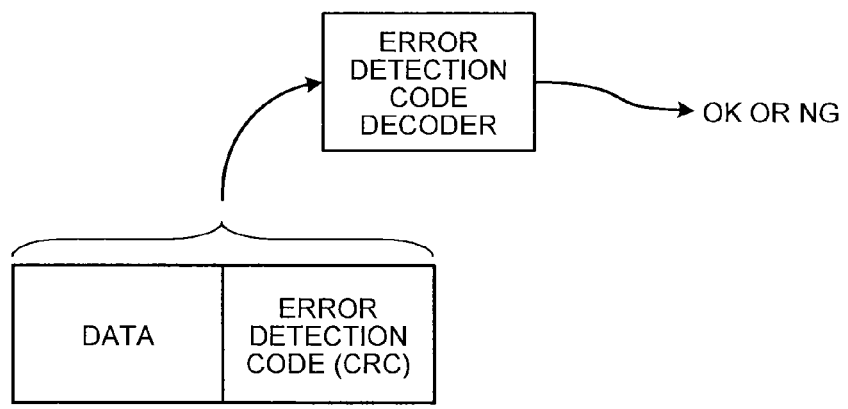
FIG. 7 is a figure illustrating an image of encode/decode of an error detection code and an error correction code.

Likewise, as illustrated in FIG. 7, when the error detection processing is performed, the error detection processing is performed on the basis of the data generated during the write operation and the CRC corresponding to the data. In the example of FIG. 3, one error correction code is generated for one set of data and CRC. However, one error correction code may be generated for multiple sets of data and CRC.

Read operation from the semiconductor memory unit 3 according to the present embodiment will be explained. When the control unit 23 is instructed to read data from the host 4, the control unit 23 instructs the encoding/decoding processing unit 24 to execute decoding operation, and instructs the NAND I/F 22 to read the data from the semiconductor memory unit 3. The NAND I/F 22 reads the data, the error detection code, and the error correction code corresponding to the data from the semiconductor memory unit 3, on the basis of the command given by the control unit 23, and outputs the read data, the error detection code, and the error correction code corresponding to the read data to the encoding/decoding processing unit 24. The decoding unit 26 of the encoding/decoding processing unit 24 performs decoding processing on the basis of the read data, the error detection code, and the error correction code, and when the read data are determined to have an error, the error correction is executed. The host I/F 21 transmits the error corrected data (when there is no error, the host I/F 21 transmits the read data obtained from the semiconductor memory unit 3) to the host 4.

Figure 8:
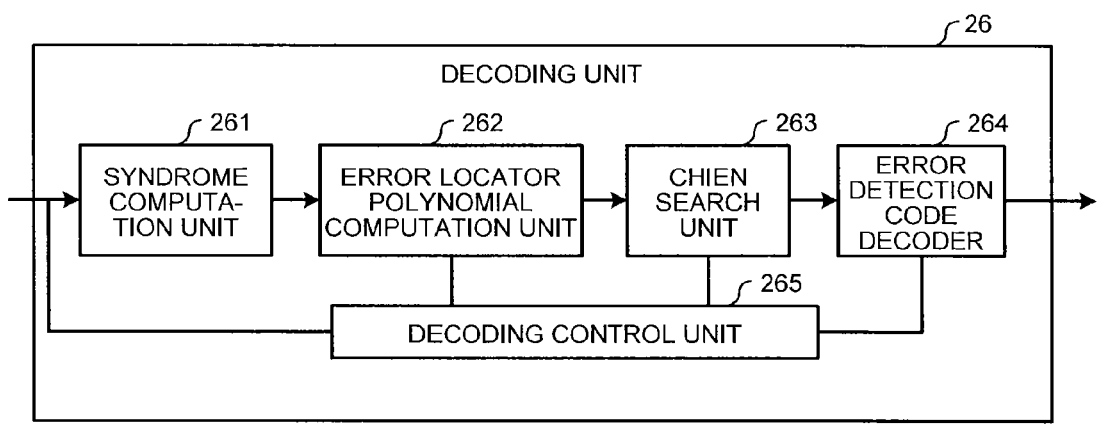
FIG. 8 is a figure illustrating an example of configuration of a decoding unit.

Hereinafter, the decoding processing according to the present embodiment will be explained. FIG. 8 is a figure illustrating an example of configuration of the decoding unit 26 according to the present embodiment. As illustrated in FIG. 8, the decoding unit (decoding device) 26 includes a syndrome computation unit (syndrome calculator) 261, an error locator polynomial computation unit (polynomial calculation unit) 262, a Chien search unit (error position calculation unit) 263, an error detection code decoder (error detector, error detection unit) 264, and a decoding control unit (decoding controller) 265. The syndrome computation unit 261, the error locator polynomial computation unit 262, and the Chien search unit 263 constitute an error correction processing unit (error correction processing decoder) performing error correction processing.

In the present embodiment, attention is paid to the fact that, in average, the number of error bits included in a code word (code) to be subjected to actual decoding error correction (error correction decoding) is less than the maximum number of bits of error correction which can be corrected in a code word (which may be hereinafter referred to as the maximum number of correction bits). Accordingly, decoding processing is performed upon setting bits less than the maximum number of correction bits as an error number expectation value, and the error detection code decoder 264 checks whether the decoding has been done correctly or not. When correction was not made by this decoding processing correctly, the error number expectation value is increased, and the calculation is performed again. Further, when correction could not be made correctly even by this decoding processing, the error number expectation value is increased, and the calculations from the syndrome computation to the error detection code decoding are performed again. In this manner, the setting of the error number expectation value, the decoding processing, and the checking of the decoding result are repeated until the data are corrected, and when correction could not be made correctly even if the error number expectation value is set at the maximum number of correction bits, it is determined that the correction is impossible.

In the present embodiment, the above processing is performed, so that the increment of the error number expectation value on each time and the amount of computing device used in the decoding processing are provided in accordance with the average number of error bits. Therefore, as compared with a case where a computing device corresponding to the maximum number of correction bits is provided, the size of the circuit can be reduced, while the average time in the correction processing is suppressed to about the same level.

In the present embodiment, an error number expectation value X is set as error correction performance of a code word, and when the error detection code decoder determines that data are corrected, the processing is terminated, and therefore, the processing can be terminated in a shorter time than a time it takes to set the maximum number of correction bits and repeatedly execute the processing from the syndrome computation to the error detection code decoder. In particular, when the number of error bits included in a code word is equal to or less than the number of computing devices (calculating devices) provided in the decoding unit, the processing from the syndrome computation to the error detection code decoder can be completed in a set of processing, and therefore, the calculation time is the same as the calculation time in a case where the computing devices are provided in accordance with the maximum number of correction bits. In general, the average error number is less than the maximum number of correction bits, and therefore, when the update method of the error number expectation value X and the like are executed appropriately, the speed of the processing can be improved in average.

Figure 9:
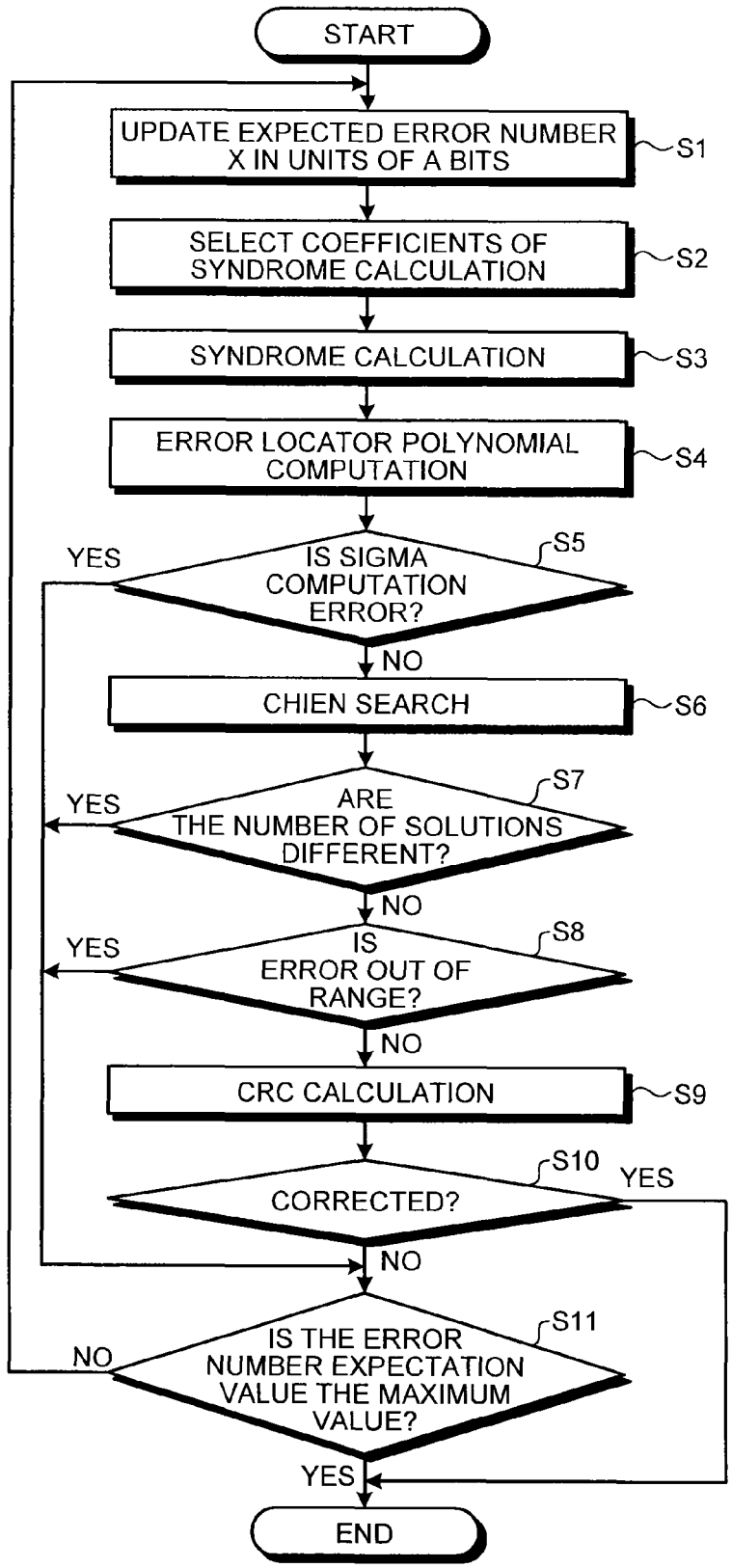
FIG. 9 is a flowchart illustrating an example of decoding processing procedure.

FIG. 9 is a flowchart illustrating an example of decoding processing procedure according to the present embodiment. Any method such as BM (Berlekamp-Massey) method, Euclidean algorithm, and Peterson method may be used for the calculation of an error locator polynomial during the decoding processing. In the explanation, however, the BM method is used. The encoding unit 25 generates an error correction code having T bits, i.e., the maximum number of correction bits.

When the control unit 23 receives a read request of data from the host 4 via host I/F 21, the control unit 23 instructs the NAND I/F 22 to read data of read target, and the NAND I/F 22 reads the data of read target as well as a corresponding CRC and the error correction code, and gives them to the decoding unit 26. When the decoding unit 26 receives the data of read target from the NAND I/F 22, the decoding unit 26 starts the decoding processing.

When the decoding processing is started, the decoding control unit 265 updates the error number expectation value X in units of A (A<T) bits (step S1). More specifically, after the processing is started, X is set as A in step S1 of the first time (the first cycle). In step S1 of the second time (the second cycle), A is added to X. As explained later, in the present embodiment, the error correction could not be performed correctly with the error number expectation value X having been set, step S1 is performed again to perform the computation again upon updating the error number expectation value X, but this one set of setting of the error number expectation value X is denoted as one cycle. It is to be noted that a variable A by which the error number expectation value X is increased is preferably a value equal to or more than the average error number. When the same value as the average error number is used, the average number of cycle can be reduced to one.

Figure 10:
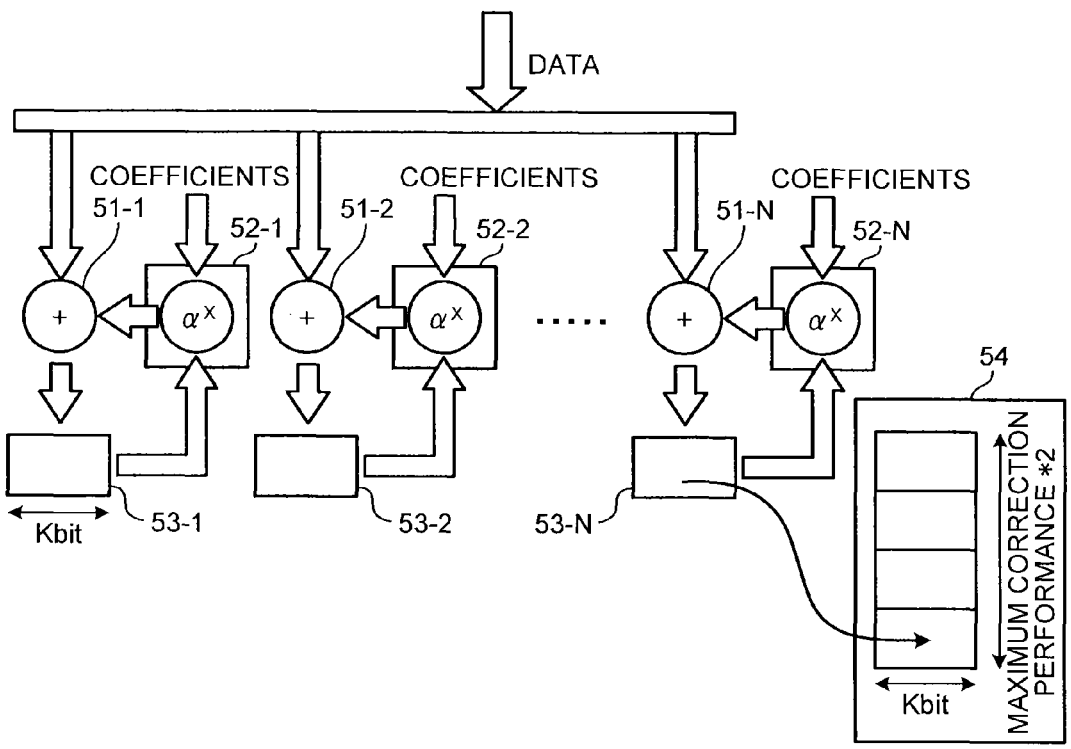
FIG. 10 is a figure illustrating an example of configuration of a syndrome computation unit and the concept of syndrome computation.

Subsequently, the decoding control unit 265 executes syndrome computation (steps S2, S3). FIG. 10 is a figure illustrating an example of configuration of the syndrome computation unit 261 and the concept of syndrome computation. For example, the syndrome computation unit 261 includes adding devices (adders) 51-1 to 51-N (N is an integer equal to or more than one), multiplying devices (calculating devices, computing devices) 52-1 to 52-N, registers 53-1 to 53-N, and a syndrome storage unit 54. The coefficients set in the multiplying devices 52-1 to 52-N are set by the decoding control unit 265 in accordance with the terms to be calculated as explained later. On the basis of the input data, the computation is performed by the adding devices 51-$i$ ($i$=1, 2, . . . , N) and the multiplying devices 52-$i$, and the computation results are input to the registers 53-$i$. Then, each of the computation results stored in the registers 53-1 to 53-N is respectively stored to the syndrome storage unit 54. The variable N representing the number of multiplying devices and adding devices is preferably set in accordance with the average error number. This is because it is necessary to be able to perform high speed correction when the average number of errors occurs. In order to correct Z bits, it is necessary to have Z×2 syndromes. For this reason, in the explanation below, the average error number is A bits, and N is A×2.

In FIG. 10, the computation width of the adding device and the multiplying device is K bits. In this case, the syndrome storage unit 54 has a region of equal to or more than K bits×the maximum number of correction bits T×2. It is to be noted that "K bits" of the computation width is determined by the degree of Galois field.

In step S3, the syndrome computation unit 261 uses the above 2×A sets of adding devices, multiplying device, and registers to respectively obtain syndromes $S(\alpha^1)$, $S(\alpha^2)$, $S(\alpha^3)$, . . . , $S(\alpha^{2X})$. More specifically, for example, when A is set at 4, and the syndrome is calculated with the error number expectation value X of the second cycle, i.e., 8, eight computing devices (N=2×A=8) calculate sixteen syndromes (8×2=16).

Figure 11:
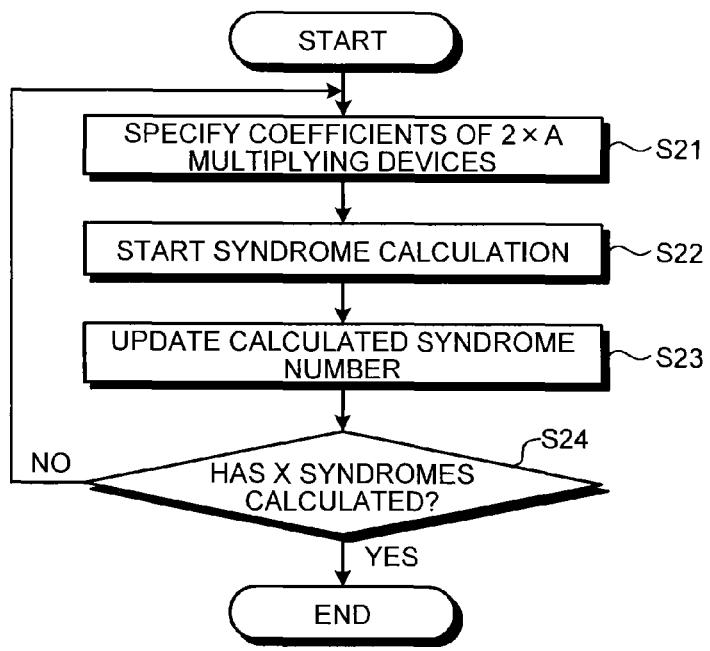
FIG. 11 is a flowchart illustrating an example of syndrome computation procedure.

FIG. 11 is a flowchart illustrating an example of syndrome computation procedure according to the present embodiment. First, when the syndrome computation is started, the decoding control unit 265 sets coefficients of 2×A multiplying devices on the basis of the error number expectation value X and the number of calculated syndromes (step S21). Then, the syndrome computation is performed by the 2×A multiplying devices, and the calculation results are stored to the syndrome storage unit 54 (step S22). Within the cycle, the number of calculated syndromes is updated (step S23). The number of calculated syndromes within the cycle is the number of syndromes calculated within one cycle in which the error number expectation value is set in step S1 but before execution of a subsequent step S1. When the error number expectation value is updated, and the syndrome computation of a subsequent cycle is started, the initialization is performed (the number of calculated syndromes is set to 0).

Then, the decoding control unit 265 determines whether the number of calculated syndromes has attained X or not (step S24). When the number of calculated syndromes is determined to have attained X (step S24, Yes), the processing is terminated. When the number of calculated syndromes is determined to be less than X (step S24, No), step S21 is performed again.

For example, when A is 4, and the syndrome is calculated with the error number expectation value X corresponding to the second cycle (cycle updated in step S1 of FIG. 9) being 8, the syndrome computation unit 261 includes eight (2×A) computation circuits, and in the syndrome computation of the first cycle, the coefficients are set so as to obtain $S(\alpha^1)$, $S(\alpha^2)$, $S(\alpha^3)$, $S(\alpha^8)$ in step S21 for the first time (the first round). $S(\alpha^1)$, $S(\alpha^2)$, $S(\alpha^3)$, . . . , $S(\alpha^8)$ are stored to the syndrome storage unit 54, and in step S21 in the second round, the coefficients are set so as to obtain $S(\alpha^9)$, $S(\alpha^{10})$, $S(\alpha^{11})$, . . . , $S(\alpha^{16})$. X syndromes are determined to be calculated in step S24 in the second round, and the syndrome computation of that cycle is terminated. In this case, the syndrome computation unit 261 includes 2×A multiplying devices, but may be configured to include 2×B (A≠B) multiplying devices. In this case, in step S21, 2×B coefficients are calculated, and in step S22, 2×B syndromes are calculated.

When the syndrome computation unit 261 finishes the calculation of the 2×X syndromes in accordance with the above processing, the 2×X syndromes stored in the syndrome storage unit 54 are given to the error locator polynomial computation unit (error locator polynomial calculator, error locator polynomial calculation unit) 262.

Back to the explanation of FIG. 9, step S3 is executed, and thereafter, the decoding control unit 265 instructs the error locator polynomial computation unit 262 to perform processing corresponding to the error number expectation value X using the syndrome computation results which have been calculated, and the error locator polynomial computation unit 262 executes the error locator polynomial computation (step S4).

The error locator polynomial computation is processing in which, where the error locator polynomial is σ(z), the coefficients $\sigma_1$, $\sigma_2$, . . . in $\sigma(z)=1+\sigma_1 z^1+\sigma_2 z^2+$ . . . are calculated from the values of the syndromes. Specifically, examples of methods include BM (Berlekamp-Massey) method, Euclidean algorithm, Peterson method, and the like. The Peterson method is a method using matrix calculation to solve simultaneous equations which hold between the coefficients σ and the syndromes. The BM method and the Euclidean algorithm are methods using a polynomial to successively calculate simultaneous equations of the coefficient σ and the syndromes.

Figure 12:
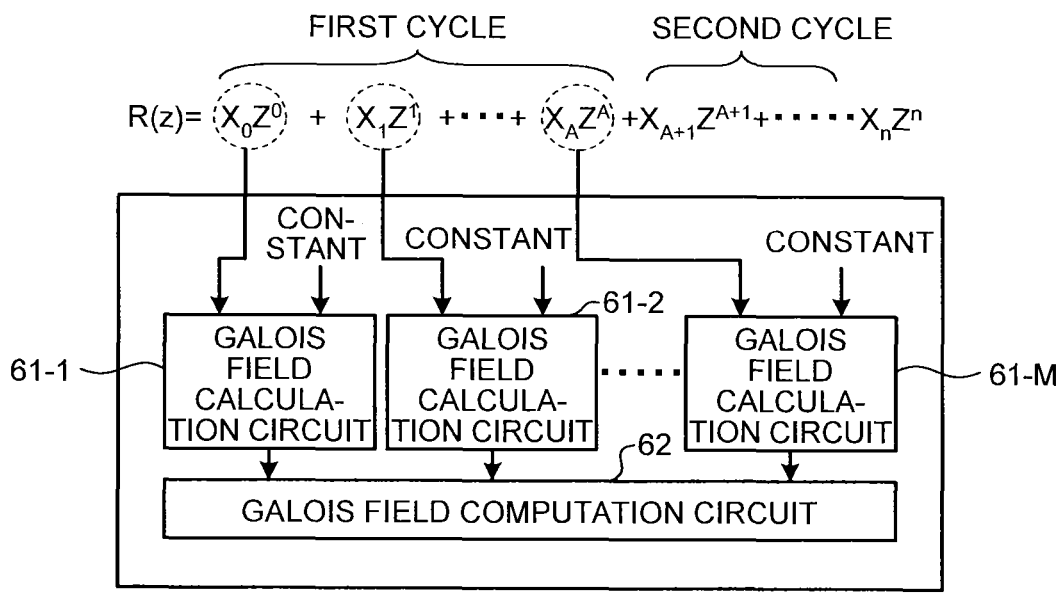
FIG. 12 is a figure illustrating an example of configuration of an error locator polynomial computation unit and the concept of polynomial computation which is used in BM method and Euclidean algorithm.

FIG. 12 is a figure illustrating an example of configuration of the error locator polynomial computation unit 262 and the concept of polynomial computation which is used in the BM method and the Euclidean algorithm. The error locator polynomial computation unit 262 includes as many Galois field calculation circuits (calculation devices, computing devices) 61-1 to 61-M as the number of the average error number and a Galois field computation circuit 62. In FIG. 12, M is set to A, in accordance with the number which the error number expectation value is increased.

The error locator polynomial computation unit 262 uses the syndromes stored in the syndrome storage unit 54 to, for example, as illustrated in FIG. 12, perform computation of each term such as multiplication of Galois fields in which the Galois field calculation circuits 61-1 to 61-M multiply polynomial $x_0 z^0, x_1 z^1, \ldots$ by constants, and stores computation result in the memory, and when all the terms of the polynomial have not yet been calculated, the remaining terms are calculated in units of the number of Galois field calculation circuits.

It should be noted that for the error locator polynomial, the calculation method is different according to calculation algorithms such as the Euclidean algorithm and the BM method, and therefore, specific calculation method is omitted. In any case, however, M Galois field calculation circuits are used to time-divisionally execute calculation of a polynomial corresponding to the error number expectation value X bits, and thereby the coefficients σ are derived.

Figure 13:
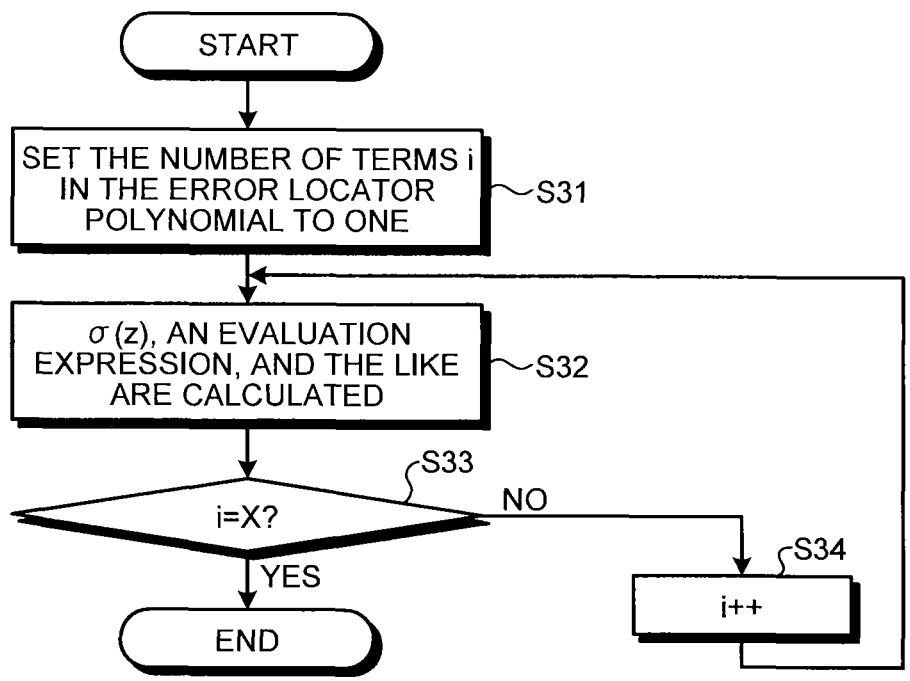
FIG. 13 is a flowchart illustrating an example of error locator polynomial computation.

FIG. 13 is a flowchart illustrating an example of error locator polynomial computation. When the error locator polynomial computation unit 262 obtains the calculation results of the syndromes from the syndrome computation unit 261, the error locator polynomial computation unit 262 sets the number of terms i in the error polynomial to one (step S31). Then, σ(z), an evaluation expression, and the like are calculated (step S32). The contents of the computation in step S32 depends on calculation algorithms such as the Euclidean algorithm and the BM method, but in general, the computation is performed by preparing as many Galois field calculation circuits as the number of terms i in the error locator polynomial. Then, calculation of the evaluation expression and the like are executed by the Galois field computation circuit 62 on the basis of the results of the Galois field calculation circuits. In the present embodiment, the number of Galois field calculation circuits is M (=A), and therefore, when i is more than M, the calculation is performed time-divisionally.

Figure 14:
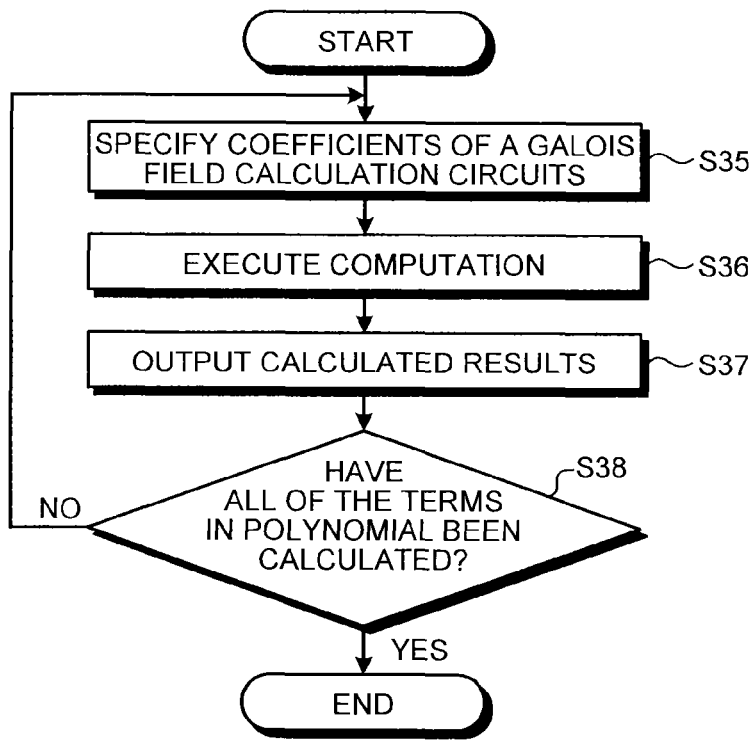
FIG. 14 is a flowchart illustrating an example of calculation procedure of step S32.

FIG. 14 is a flowchart illustrating an example of calculation procedure of step S32. First, the decoding control unit 265 specifies coefficients of A Galois field calculation circuits 61-1 to 61-M (=A) (step S35), and executes the computation (step S36). Then, the results obtained from the computation are output to the decoding control unit 265 (step S37). The decoding control unit 265 determines whether all of the i terms in the polynomial have been calculated or not (step S38). When all of the i terms in the polynomial are determined to have been calculated (step S38, Yes), the processing is terminated, and step S33 of FIG. 13 is subsequently performed. When there are terms of the i terms in the polynomial which have not yet been calculated (step S38, No), it is returned to step S35 for the remaining terms are subsequently calculated.

Back to the explanation of FIG. 13, after the computation in step S32, the decoding control unit 265 determines whether i is equal to X or not (step S33). When i=X holds (step S33, Yes), the processing is terminated, and, step S5 of FIG. 9 is subsequently performed. When i=X does not hold (step S33, No), i is increased by one (step S34), and step S32 is subsequently performed. In the above expression, M is equal to A, and the computation is performed for every A bits. In a case where M is not equal to A, the computation is performed for every M bits. For example, when the actual error i is determined to be less than X, which is found from the result of the evaluation expression in step S32, operation for terminating the processing may be performed even when i is not yet equal to X.

Subsequently, the error locator polynomial computation unit 262 determines whether an error is detected in the error locator polynomial computation on the basis of the computation results. When an error is detected, the error locator polynomial computation unit 262 notifies the decoding control unit 265 of the error (step S5). For example, in a calculation algorithm for determining whether the coefficients σ derived using the evaluation function are correct or not, the determination is made by determining whether the results obtained by calculating the evaluation function are correct or not. It should be noted that step S5 may not be performed when using, for example, a calculation algorithm of error locator polynomial in which no evaluation function is defined.

When no error is detected (step S5, No), the decoding control unit 265 sets, in the multiplying devices 71-1 to 71-L of the Chien search unit 263, the coefficients σ derived from the calculation of the error locator polynomial, and the Chien search unit 263 executes identification of an error position from the coefficients σ (step S6). The Chien search is a method in which values are successively substituted into the error locator polynomial σ(z), and an error locator (error position), which is a value at which σ(z)=0 holds, is searched.

Figure 15:
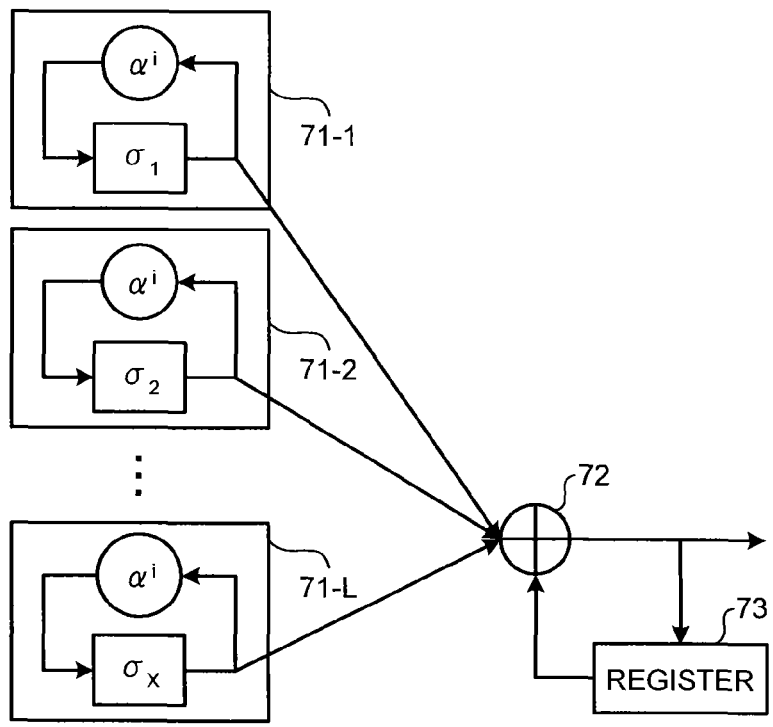
FIG. 15 is a figure illustrating an example of configuration of a Chien search unit and a figure illustrating the concept of the Chien search.

FIG. 15 is a figure illustrating an example of configuration of the Chien search unit 263 and a figure illustrating the concept of the Chien search. The Chien search unit 263 includes multiplying circuits (calculating devices, calculating unit, computing devices) 71-1 to 71-L, an adding device 72, and a register 73. It should be noted that L may be an integer equal to or more than one, but in FIG. 15, L is equal to A because of the same reason as that of the method for determining the computing devices of the syndromes and the error locator polynomial. The adding device 72 reads value stored in the register, and performs accumulative ExOR computation between the read value and each of the results of multiplications of the multiplying circuits 71-1 to 71-L, and stores the computation result to the register 73. The initial value of the register 73 is set to 0.

Figure 16:
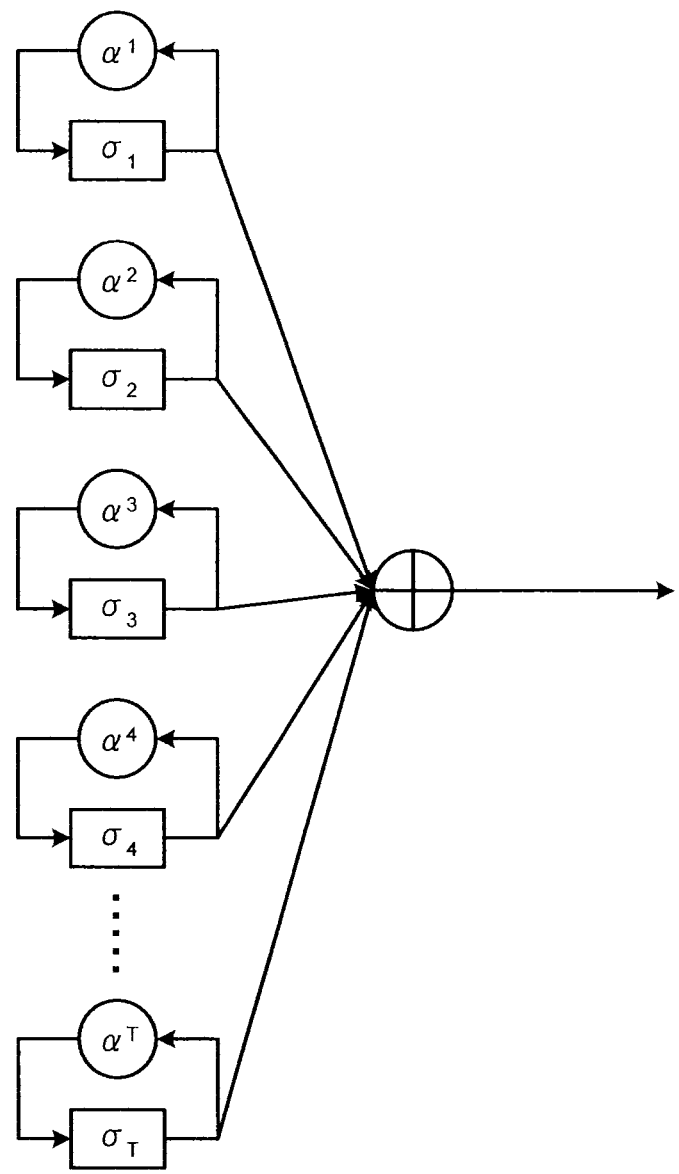
FIG. 16 is a conceptual diagram illustrating a calculation procedure of generally-available Chien search.

FIG. 16 is a conceptual diagram illustrating a calculation procedure of generally-available Chien search. In the generally-available Chien search, as many computing devices as the number of maximum correction performance and registers corresponding to the computing devices are provided. The registers set, as initial values, $\sigma_1, \sigma_2, \ldots, \sigma_T$ obtained from the calculation of the error locator polynomial. The computing devices corresponding to the contents of the registers respectively perform the computation of constants $\alpha^1, \alpha^2, \alpha^3, \ldots, \alpha^T$, and stores the computation results to the registers as well as performs ExOR computation of each of the computation results.

Figure 17:
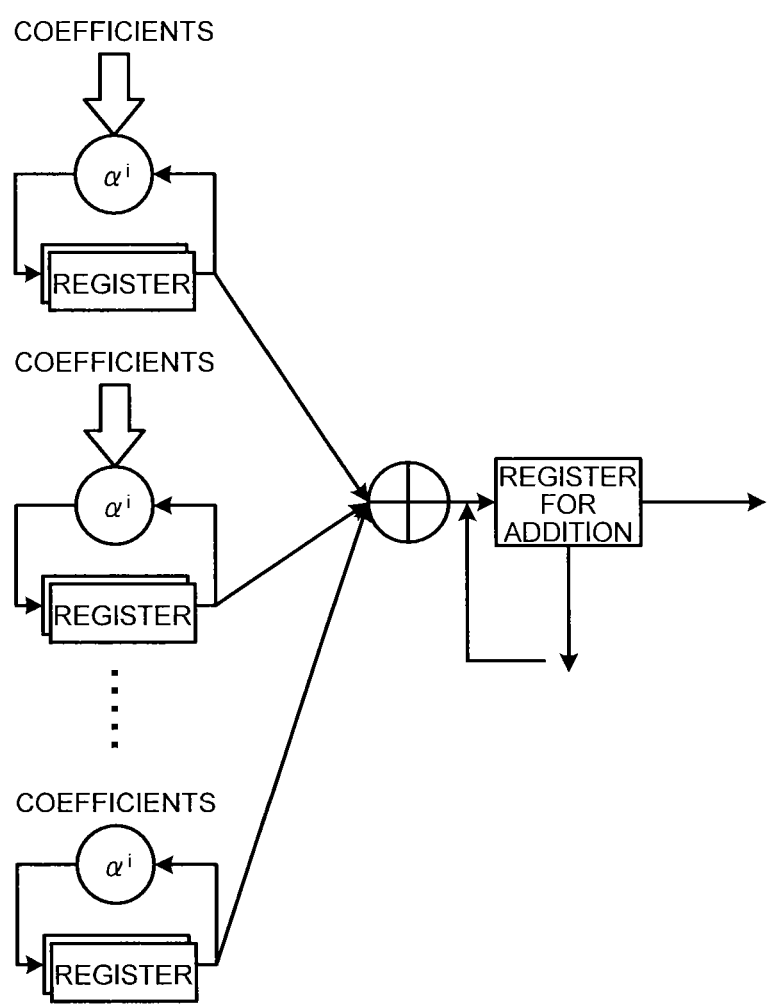
FIG. 17 is a conceptual diagram illustrating a calculation procedure of the Chien search according to the first embodiment.

FIG. 17 is a conceptual diagram illustrating a calculation procedure of the Chien search according to the present embodiment. FIG. 17 illustrates a concept for performing Galois field computation, executed in the Chien search corresponding to the error number expectation value X, in a case where L (=A) multiplying circuits 71-1 to 71-L are used in the computation. For example, when A is 4, eight coefficients $\sigma_1$ to $\sigma_8$ are calculated in the second cycle calculation in the error locator polynomial computation, and the eight coefficients $\sigma_1$ to $\sigma_8$ are stored to the registers in the multiplying circuits 71-1 to 71-L. The decoding control unit 265 initializes the register 73 which is a register for addition.

Subsequently, the decoding control unit 265 selects the registers $\sigma_1$ to $\sigma_4$, and respectively sets the coefficients to the multiplying circuits 71-1 to 71-L. The multiplying circuits 71-1 to 71-L perform the Galois field computation on the basis of $\sigma_1$ to $\sigma_4$ and the coefficients, and stores the results of multiplications to the registers in the multiplying circuits 71-1 to 71-L. Then, the results of multiplications of all the multiplying circuits 71-1 to 71-L and the content of the register 73 are added and the result of addition is stored to the register 73. Subsequently, the registers $\sigma_5$ to $\sigma_8$ (the registers in the multiplying circuits 71-1 to 71-L) are selected, and the coefficients are respectively set to the multiplying circuits 71-1 to 71-L. The multiplying circuits 71-1 to 71-L perform the Galois field computation on the basis of $\sigma_5$ to $\sigma_8$ and the coefficients, and stores the results of multiplications to the registers. The results of multiplications of all the multiplying circuits 71-1 to 71-L and the content of the register 73 are added and the result of addition is stored to the register 73. Then, if the content of the register 73 is zero, this is determined to be an error locator.

Figure 18:
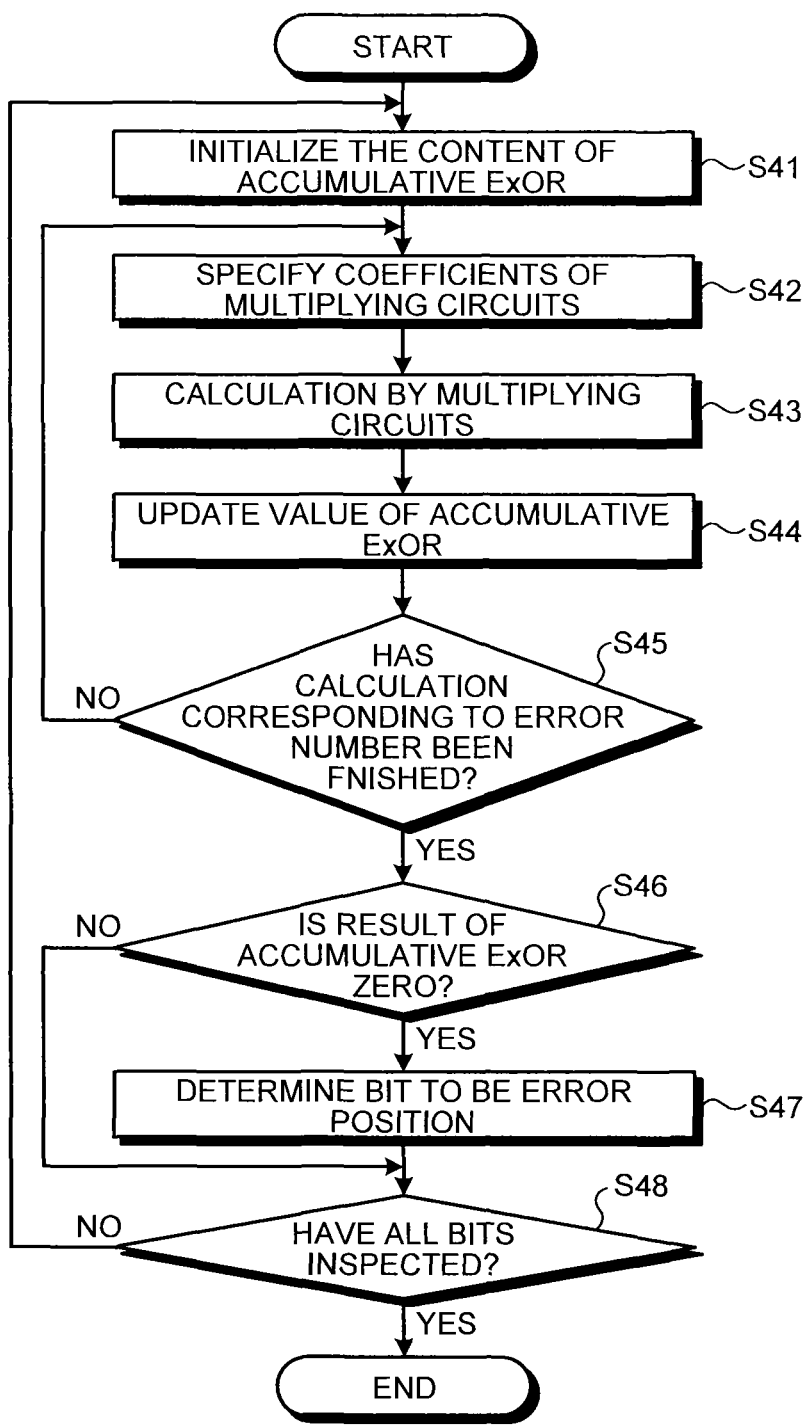
FIG. 18 is a flowchart illustrating an example of the Chien search procedure.

FIG. 18 is a flowchart illustrating an example of the Chien search procedure according to the present embodiment. The Galois field computation of FIG. 17 explained above corresponds to an example where steps S41 to S44 of FIG. 18 are executed for two rounds. First, when the Chien search is started, the value of the register 73 is initialized (step S41), and the coefficients of the multiplying circuits 71-1 to 71-L corresponding to the calculation results of the error locator polynomial (or intermediate results of calculation) are set (step S42). Then, the coefficient given by the L multiplying circuits 71-1 to 71-L of the Chien search unit 263 and the data in the registers are calculated, and the results of multiplications are written back to the registers again (step S43). The adding device 72 obtains an accumulative ExOR between the results of multiplications of the multiplying circuits 71-1 to 71-L and the value of the register 73, and stores the obtained result to the register 73 (step S44). Then, the decoding control unit 265 determines whether the calculation corresponding to the error number expectation value X set in the cycle has been finished or not (step S45).

When the calculation corresponding to the error number expectation value X set in the cycle is finished (step S45, Yes), the decoding control unit 265 determines whether the result of the accumulative ExOR is zero or not (step S46). When the result of the accumulative ExOR is determined to be zero (step S46, Yes), the bit corresponding the substituted $\alpha^i$ is determined to be an error position (step S47), and a determination is made as to whether all the bits included in the code word has been inspected or not (step S48). When all the bits are determined to have been inspected (step S48, Yes), the processing is terminated. When all the bits are determined to have not been inspected (step S48, No), by returning to step S41, and a subsequent bit is inspected upon changing the value i of $\alpha^i$. When the number of bits of a code word is less than the number of bits usable in the space of the Galois field, processing for calculating the position of starting the Chien search may be added, the details of which are omitted.

When the calculation corresponding to the error number expectation value X is determined not to have been finished in step S45 (step S45, No), step S42 is subsequently performed. When the result of the accumulative ExOR is determined not to be zero in step S46 (step S46, No), step S48 is subsequently performed.

When the result of the ExOR computation is determined to be zero, the decoding control unit 265 determines that there is an error in the corresponding bit, and inverts the corresponding bit. The decoding control unit 265 holds the number of bits determined to be erroneous by the Chien search, and holds the corresponding error positions.

Back to the explanation of FIG. 9, after the Chien search is finished, a determination is made as to whether the number of terms in the polynomial derived from the calculation of the error locator polynomial is different from the number of error locators derived from the Chien search (step S7). When the number of solutions are the same (step S7, No), the decoding control unit 265 determines whether the error position is out of a range set as an error correction target (step S8). When the error position is determined not to be out of the range set as the error correction target (step S8, No), the decoding control unit 265 actually inverts the bit of the error position indicated by the error locator, and instructs the error detection code decoder 264 to start the error detection processing. The error detection code decoder 264 executes the error detection processing (CRC calculation) (step S9). More specifically, the error detection code decoder 264 determines whether there is any error in the error-corrected data using the error-corrected data and the corresponding CRC.

After the error detection processing is executed, the decoding control unit 265 determines whether the error correction is correctly done or not on the basis of the determination as to whether there is any error in the result of the error detection processing executed by the error detection code decoder 264 (step S10). When the error correction is determined to have been correctly done (step S10, Yes), the processing is terminated.

On the other hand, in a case where an error is detected in step S5 (step S5, Yes), and the number of solutions are determined to be different in step S7 (step S7, Yes), the following processing is performed. When the error position is determined to be out of the range set as the error correction target in step S8 (step S8, Yes), the decoding control unit 265 determines whether the error number expectation value is the maximum value (i.e., X=T) (step S11). When the error number expectation value is determined to be the maximum value (step S11, Yes), the decoding control unit 265 determines that the error correction is impossible, and terminates the processing. When the error number expectation value is determined not to be the maximum value (step S11, No), step S1 is subsequently performed. When returning back to step S1 by way of step S11, processing for a subsequent cycle is started. When the error correction cannot be performed correctly in step S10 (step S10, No), step S11 is subsequently performed.

With the above processing, even when computation circuits corresponding to the maximum number of correction bits are not provided, the decoding processing can be performed. For example, when the maximum number of correction bits is 20 bits, and A is 4, the following processing is performed. When the actual number of error occurrence is 4 bits or less, the calculation is terminated in the first cycle, and this improves the speed of the processing.

The above method for updating the error number expectation values is merely an example. It may be any method as long as it is a method for increasing the error number expectation value in every cycle, for example, a method in which, after the processing is started, X is set to A' (A'<A) in the first step S1, and A is added to X after that.

In the present embodiment, the syndrome computation unit 261, the error locator polynomial computation unit 262, and the Chien search unit 263 have, e.g., different settings of coefficients of the computations, but some of the computations such as multiplications are the same. Therefore, some of the computing devices may be shared by the syndrome computation unit 261, the error locator polynomial computation unit 262, and the Chien search unit 263. For example, a single computing device may be used by the multiplying devices 52-1 to 52-N of the syndrome computation unit 261 and the Galois field calculation circuits 61-1 to 61-M of the error locator polynomial computation unit 262. In this configuration, the computation circuits can be further reduced.

Each of the numbers N, M, L of computing devices provided in the syndrome computation unit 261, the error locator polynomial computation unit 262, and the Chien search unit 263 may be a different value as long as at least one of N/2 (i.e. the number of correction bits that can be supported by the syndrome computation unit 261), M, and L is a number less than T. More specifically, when the minimum value of N/2, M, and L is denoted as J, J is required to be less than T.

As described above, in the present embodiment, using the computation circuits corresponding to the number of bits which is less than the maximum number of correction bits, the error number expectation value is set to the predetermined value as the initial value, and the syndrome computation supporting the error number expectation value, the error locator polynomial computation, and the error correction processing by the Chien search are performed. When the error correction is determined not to have been correctly performed on the basis of the data having been subjected to the error correction processing and the CRC, the error number expectation value is increased, processing for the increment from the previous error correction processing is executed as error correction processing of a subsequent cycle. Then, until the error correction is done correctly, or until the error number expectation value is set as the maximum number of correction bits, the error number expectation value is updated, and the error correction processing is repeated. Therefore, the circuits in the decoding unit can be greatly reduced as compared with a case where as many computation circuits as the maximum number of correction bits are provided. In addition, the average speed of the decoding processing can be improved.

Second Embodiment

In the first embodiment, when processing for the second and subsequent cycles is performed, the computation is performed independently from the calculation result for the first cycle. For example, A is set to 4, and eight syndromes, i.e., $S(\alpha^1)$, $S(\alpha^2)$, $S(\alpha^3)$, ..., $S(\alpha^8)$ are obtained in the syndrome computation for the second cycle. On the other hand, in some of the processing explained in the first embodiment, calculation in a subsequent cycle can be reduced by using a result obtained during the calculation in the previous cycle (hereinafter referred to as reuse information).

For example, when A is set to 4, the values in the syndrome computation are as follows: among $S(\alpha^1)$, $S(\alpha^2)$, $S(\alpha^3)$, ..., $S(\alpha^8)$ obtained in the second cycle, $S(\alpha^1)$, $(s\alpha^2)$, $S(\alpha^3)$, $S(\alpha^4)$ have the same values as the values obtained in the first cycle. Therefore, in the syndrome computation, the values calculated in each cycle are held in a storage unit in the decoding unit 26 (which may be a storage unit outside of the decoding unit 26), so that in the calculation of the subsequent cycle, only a portion (difference) which has not been calculated in the previous cycles can be calculated. For example, when A is set to 4, $S(\alpha^5)$, ..., $S(\alpha^8)$ are calculated in the second cycle, and $S(\alpha^1)$, $S(\alpha^2)$, $S(\alpha^3)$, $S(\alpha^4)$ may be obtained by using the held calculation results in the previous cycles as the reuse information.

In the error locator polynomial computation, it is impossible to calculate only the difference, but some of the values calculated during the calculation in the previous cycle can be used in the subsequent cycle, and therefore, when information required for the calculation of the subsequent cycle is held as the reuse information, some of the calculation in the subsequent cycle can be simplified.

Figure 19:
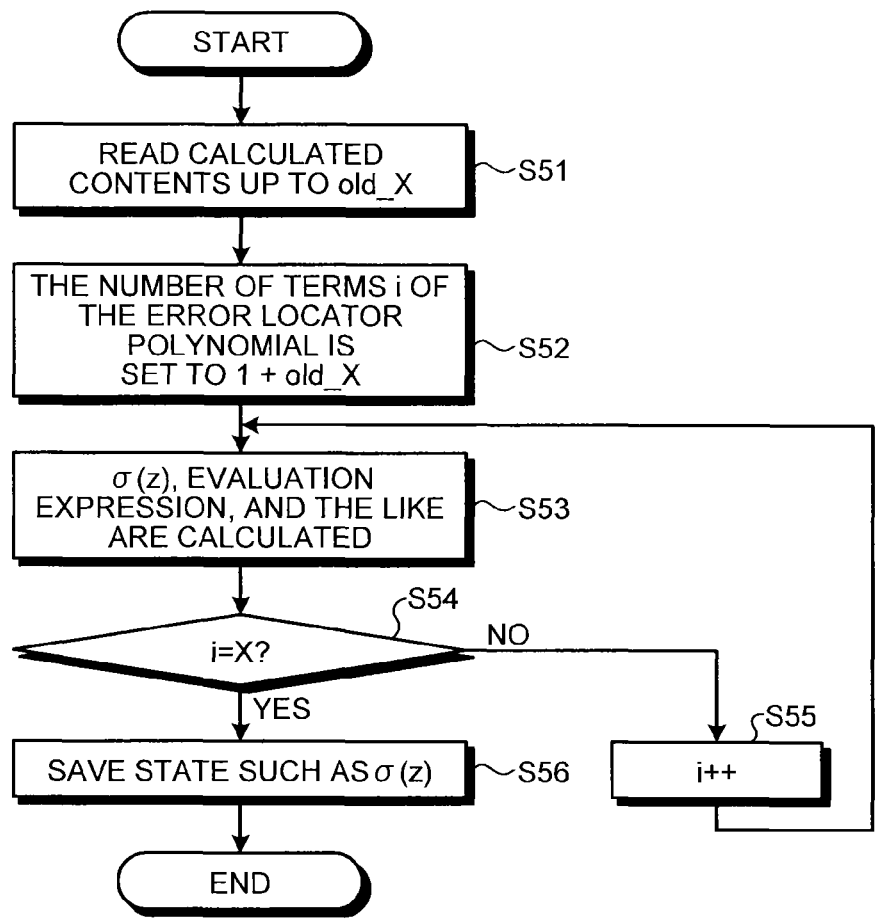
FIG. 19 is a figure illustrating an example of error locator polynomial computation procedure where the calculation result is reused.

FIG. 19 is a figure illustrating an example of error locator polynomial computation procedure where the calculation result is reused. First, the calculated contents up to the error number expectation value (old_X) in the previous cycle (information which is calculated and saved in the previous cycle to be used in the calculation of the subsequent cycle, and this will be hereinafter referred to as reuse information) is read from the memory unit in the decoding unit 26 (which may be a storage unit outside of the decoding unit 26) (step S51). Then, the number of terms i of the error locator polynomial is set to 1+old_X (step S52). In the first cycle, step S51 is not executed, and in step S52, old_X is set to 0.

Then, σ(z) and the evaluation expression are likewise calculated using the reuse information (step S53). Subsequently, the decoding control unit 265 determines whether i is X or not (step S54). When i is determined to be X (step S54, Yes), reuse information (such as σ(z)) is stored to the memory unit (step S56), and the processing is terminated. When i is determined not to be X (step S54, No), i is increased by one (step S55), and step S53 is subsequently performed. In step S53, when the number (M) of Galois field calculation circuits 61-1 to 61-M is less than i, the processing is performed time-divisionally for every M bits like the first embodiment. The operation of the present embodiment other than the above is the same as the first embodiment.

As described above, in the present embodiment, in the syndrome computation and the error locator polynomial computation, the information that can be used in the calculation of the subsequent cycle is held as the reuse information, and the computation is performed using the reuse information in the subsequent cycle. Therefore, the same effects as the first embodiment can be obtained, and in addition, the amount of computation can be reduced as compared with the first embodiment.

Third Embodiment

Figure 20:
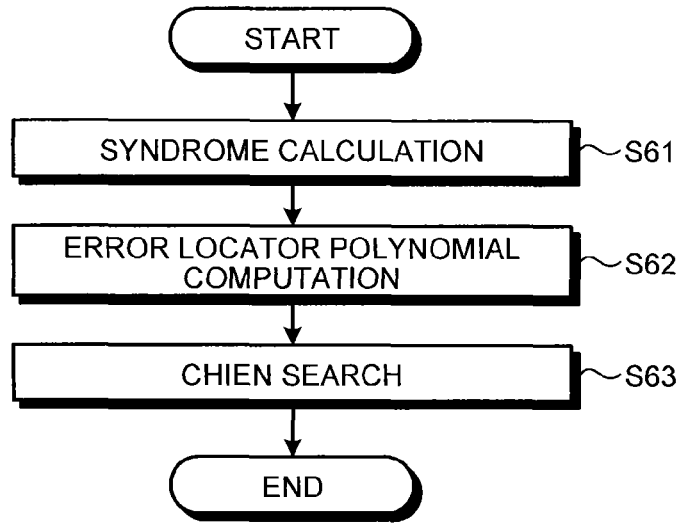
FIG. 20 is a flowchart illustrating an example of decoding processing procedure according to a third embodiment.

FIG. 20 is a flowchart illustrating an example of decoding processing procedure according to a third embodiment. In the present embodiment, an example of the Chien search circuit of which circuit size is reduced will be explained. The configuration of a semiconductor storage device 1 according to the present embodiment is the same as that of the first embodiment. Constituent elements having the same functions as those of the first embodiment are denoted with the same reference numerals as those of the first embodiment, and repeated description thereabout is omitted. Any method such as the BM (Berlekamp-Massey) method, the Euclidean algorithm, and the Peterson method may be used for the calculation of an error locator polynomial during the decoding processing. In the explanation, however, the BM method is used. An encoding unit 25 generates an error correction code having T bits, i.e., the maximum number of correction bits.

In the example of configuration in FIGS. 2 and 8, the error detection code encoder 251 and the error detection code decoder 264 are provided. In the present embodiment, it is not necessary to attach an error detection code. When the error detection code is not attached, it is not necessary to provide the error detection code encoder 251 of FIG. 2 and the error detection code decoder 264 of FIG. 8.

When a control unit 23 receives a read request of data from a host 4 via a host I/F 21, the control unit 23 instructs the NAND I/F 22 to read data of read target, and the NAND I/F 22 reads the data of read target as well as a corresponding CRC and the error correction code, and gives them to the decoding unit 26. When the decoding unit 26 receives the data of read target from the NAND I/F 22, the decoding unit 26 starts decoding processing.

When the decoding processing is started, a syndrome computation unit 261 is instructed to execute syndrome computation, and the syndrome computation unit 261 executes the syndrome computation (step S61). Thereafter, the decoding control unit 265 instructs an error locator polynomial computation unit 262 to execute error polynomial computation using the calculated syndrome computation result, and the error locator polynomial computation unit 262 executes the error locator polynomial computation (step S62). It should be noted that any method may be used as the error locator polynomial computation.

Subsequently, the decoding control unit 265 instruct a Chien search unit 263 to perform Chien search using the result of the error locator polynomial computation. The Chien search unit 263 executes the Chien search using coefficients $\sigma_1, \sigma_2, \ldots$ (step S63), identifies an error position, and terminates the processing. The Chien search is a method in which values are successively substituted into the error locator polynomial $\sigma(z)$, and an error locator (error position), which is a value at which $\sigma(z)=0$ holds, is searched. When $\sigma(z)=0$ holds in the Chien search, the decoding control unit 265 determines that there is an error in the corresponding bit, and inverts the corresponding bit, thus executing the error correction.

After the above decoding processing, the error detection code decoder 264 determines whether there is any error in the error-corrected data using the error-corrected data and the corresponding CRC. The control unit 23 transmits, to the host 4, via host I/F 21, data which are determined to have no error by the error detection code decoder 264. When it is determined that there is an error, predetermined processing that is defined with the host 4 is executed (for example, the host 4 is notified of the error).

Figure 21:
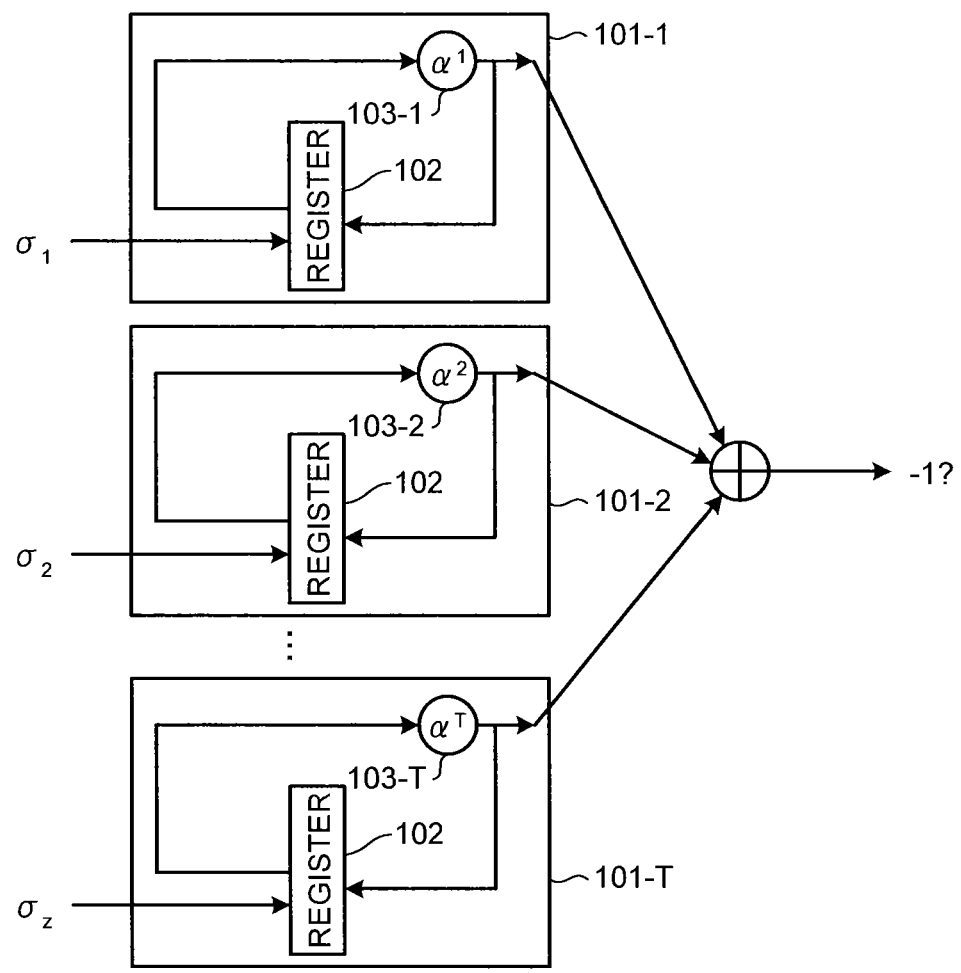
FIG. 21 is a figure illustrating an example of configuration of a generally-available Chien search circuit.

Subsequently, the Chien search unit 263 of the present embodiment will be explained. FIG. 21 is a figure illustrating an example of configuration of a generally-available Chien search circuit. As illustrated in FIG. 21, where the maximum number of bits of error correction defined in the system is T, the generally-available Chien search circuit includes computing devices 101-1 to 101-T and an adding device for adding the outputs of all the computing devices, and determines that a position of a bit where the result of addition is −1 is an error position. A computing device 101-$i$ ($i=1, 2, \ldots, T$) includes a register 102 holding a coefficient $\sigma i$ calculated from the error locator polynomial computation and a multiplying device 103-$i$ for performing multiplication by $\alpha^i$. In the content of the register 102, the coefficient $\sigma_i$ is stored as the initial value, and every time multiplication by $\alpha^i$ is executed in order to perform error determination of each bit position of a code word, the register 102 is overwritten and updated with the calculated result of multiplication.

As described above, the generally-available Chien search circuit includes T computing devices which is as many as the maximum number of bits of error correction defined in the system. However, the number of error bits existing in a code word is much less than the average number of error bits defined in the system. For this reason, most of the circuits in the Chien search circuit are not effectively used. In view of this situation, the present embodiment provides a method for reducing the size of the circuit of the Chien search circuit by time-divisionally using computing devices which are less than the maximum number of correction bits defined in the system.

Figure 22:
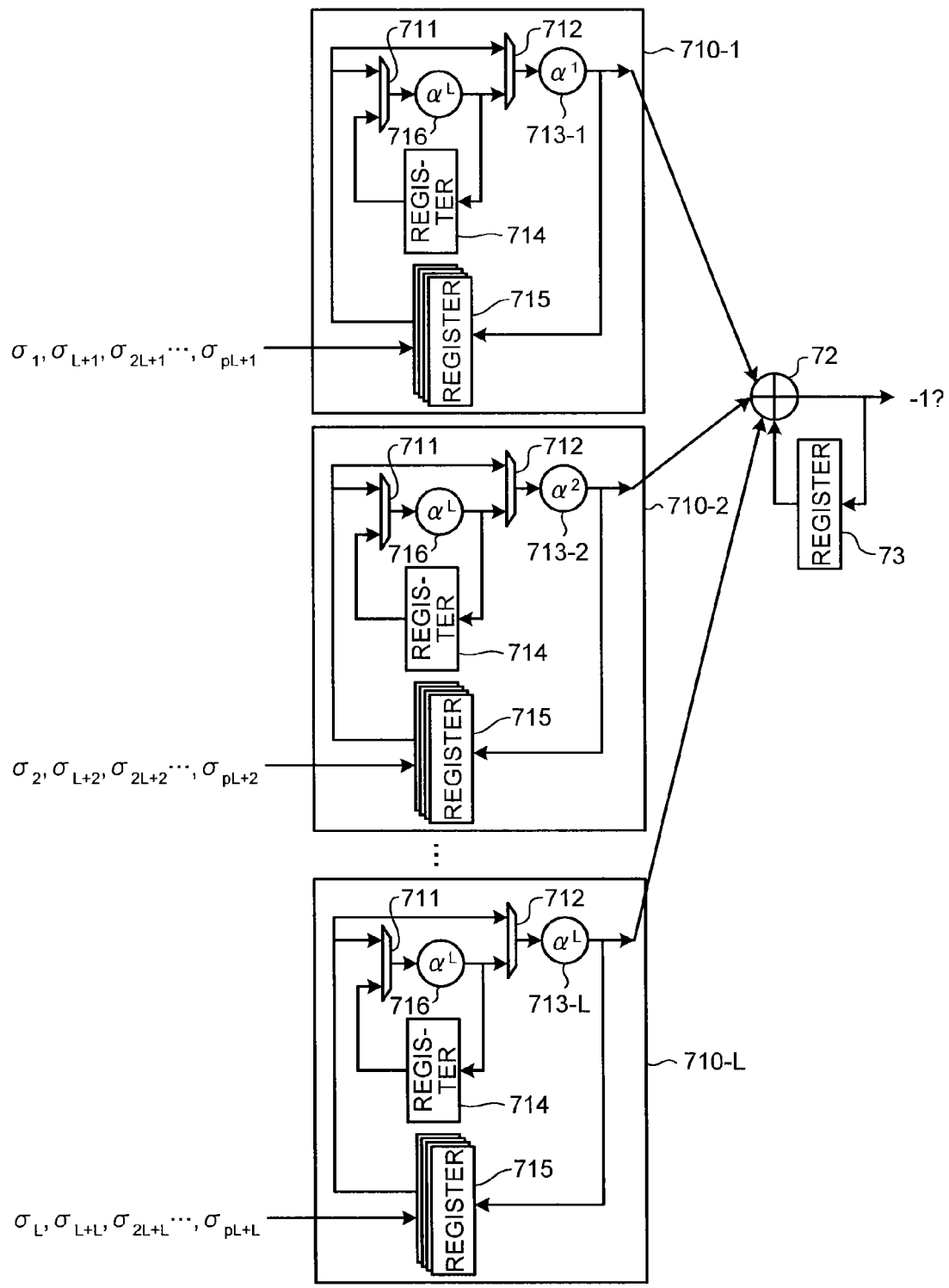
FIG. 22 is a figure illustrating an example of configuration of a Chien search unit (Chien search circuit) according to the third embodiment.

FIG. 22 is a figure illustrating an example of configuration of a Chien search unit 263 (Chien search circuit) according to the present embodiment. The Chien search circuit according to the present embodiment includes computing devices 710-1 to 710-L (L<T), an adding device 72, and a register 73 (first register). The computing device 710-$i$ ($i=1, 2, \ldots, L$) includes a selector 711 (first selector), a selector 712 (third selector), a multiplying device 713-$i$ (first multiplying device) for performing multiplication by $\alpha^i$, a register 714 (third register), a register 715 (second register), and a multiplying device 716 (second multiplying device) for performing multiplication by $\alpha^L$. In the present embodiment, as illustrated in FIG. 22, computing devices 710-1 to 710-L which are less than T are used, so that reduction of the speed of the decoding processing is suppressed, and the circuit size is reduced.

Hereinafter, calculation procedure of the Chien search according to the present embodiment will be explained. After the error locator polynomial computation, the decoding control unit 265 controls the Chien search unit 263 in accordance with the number of terms Y in the error locator polynomial. When the number of terms Y in the error locator polynomial is aL+b (Y=aL+b), the decoding control unit 265 performs control such that the coefficient $\sigma_n$ of the n-th term of the error locator polynomial is stored to the (int(n/L)+1)-th position of the register 715 of the computing device 710-$p$ (p=n mod L (remainder obtained by dividing n by L)).

First, operation of the Chien search unit 263 when the number of terms Y in the error locator polynomial is equal to or less than L will be explained. The computing devices 710-1 to 710-Y execute subsequent operation in parallel. The register 715 stores a coefficient of a corresponding term in the error locator polynomial. The selector 712 selects a register 715 as an input, and data stored in the register 715 (a coefficient of a term in the error locator polynomial) are input to the first multiplying device (the multiplying device 713-$i$ of the computing device 710-$i$ ($i=1, 2, \ldots, Y$)), and the first multiplying device executes the computation. The adding device 72 performs ExOR computation of the computation results which are output from the first multiplying devices of the computing devices 710-1 to 710-Y. The decoding control unit 265 determines whether there is any error in each bit (the degree of the error locator polynomial) according to whether the ExOR computation result is −1 or not (whether the ExOR computation result is 0 or not). When Y is equal to or less than L, each of the computing devices 710-1 to 710-L calculates one or zero term.

Figure 23:
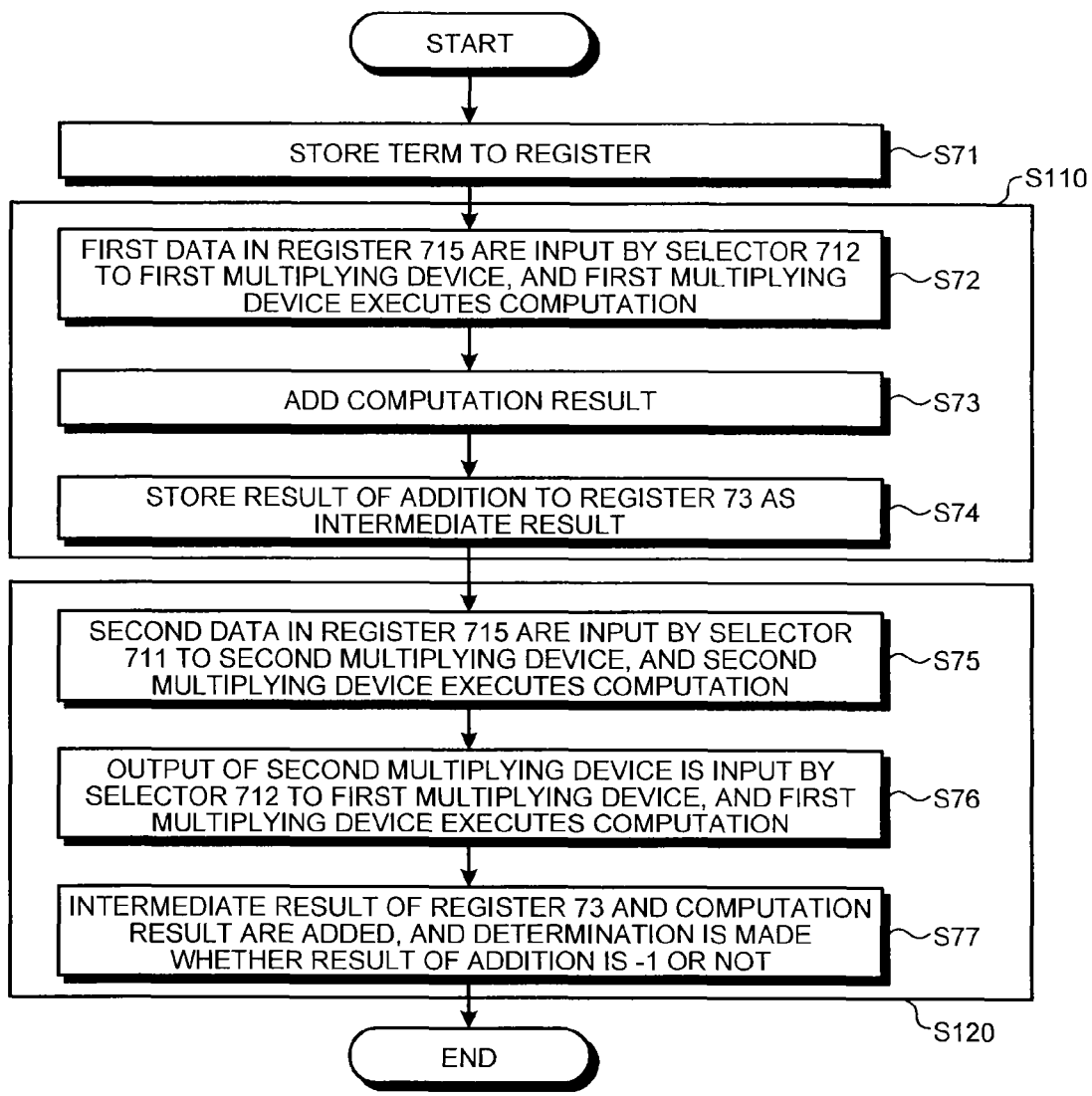
FIG. 23 is a figure illustrating an example of processing procedure of the Chien search where $L<Y\leq 2L$ holds.

Subsequently, operation of the Chien search unit 263 when the number of terms Y in the error locator polynomial is more than L but less than 2L (L<Y≤2L) will be explained. FIG. 23 is a figure illustrating an example of processing procedure of the Chien search where L<Y≤2L holds. In this case, each of the computing devices 710-1 to 710-L calculates one or two terms. Accordingly, the decoding control unit 265 performs control so as to respectively calculate the first term using all the computing devices 710-1 to 710-L (step S110), and thereafter, respectively calculate the second term using the computing devices 710-1 to 710-Y' (Y'=Y−L) (step S120).

First, the register 715 stores a coefficient of a corresponding term in the error locator polynomial (step S71). Then, using all the computing devices 710-1 to 710-L, the calculations of the first term is started, and the selector 712 selects the register 715 as an input. The first data in the register 715 are input to the first multiplying device, and the first multiplying device executes computation (step S72). The value of the register 715 is updated with the computation result provided by the first multiplying device. The output of the first multiplying device is stored to the first position of the register 715. The adding device 72 executes ExOR computation of the computation results which are output from the first multiplying devices of the computing devices 710-1 to 710-Y, and the ExOR computation result is stored to the register 73 (step S73). At this occasion, the decoding control unit 265 does not determine whether there is an error in each bit (the degree of the error locator polynomial) according to whether the ExOR computation result (result of addition) is −1 or not. Steps S71 to S73 are the same as those in a case where Y is equal to or less than L.

The decoding control unit 265 stores the result added by the adding device 72 (the result of addition of the computation result provided by the computing devices 710-1 to 710-L) to the register 73 as an intermediate result (step S74).

Thereafter, the decoding control unit 265 starts calculating the second term using the computing devices 710-1 to 710-Y', and the selector 711 of each the computing devices 710-1 to 710-Y' selects the register 715 as an input, so that the second data stored in the register 715 are input to the second multiplying device (multiplying device 716), and the second multiplying device performs multiplication by $\alpha^L$ (step S75). Subsequently, the selector 712 inputs the computation result of the second multiplying device into the first multiplying device, and the first multiplying device performs computation (step S76). The output of the first multiplying device is stored to the second position in the register 715. The adding device 72 adds the intermediate result stored in the register 73 and the computation result of the first multiplying device, and the decoding control unit 265 determines whether there is any error in each bit according to whether the result of addition is −1 or not (step S77), and the processing is terminated.

According to the above operation, the j-th term (L<j≤Y) is not only multiplied by $\alpha^L$ by the second multiplying device but also multiplied by $\alpha^{j-L}$ by the first multiplying device. Accordingly, multiplication by $\alpha^j$ can be executed ($\alpha^L \times \alpha^{j-L} = \alpha^j$). The computation results of the (L+1 to j)-th terms (L<j≤Y) and the intermediate result stored in the register 73 can be added. This can achieve the same processing as the processing for calculating each of all the 1st to the j-th terms and thereafter adding them all.

Figure 24:
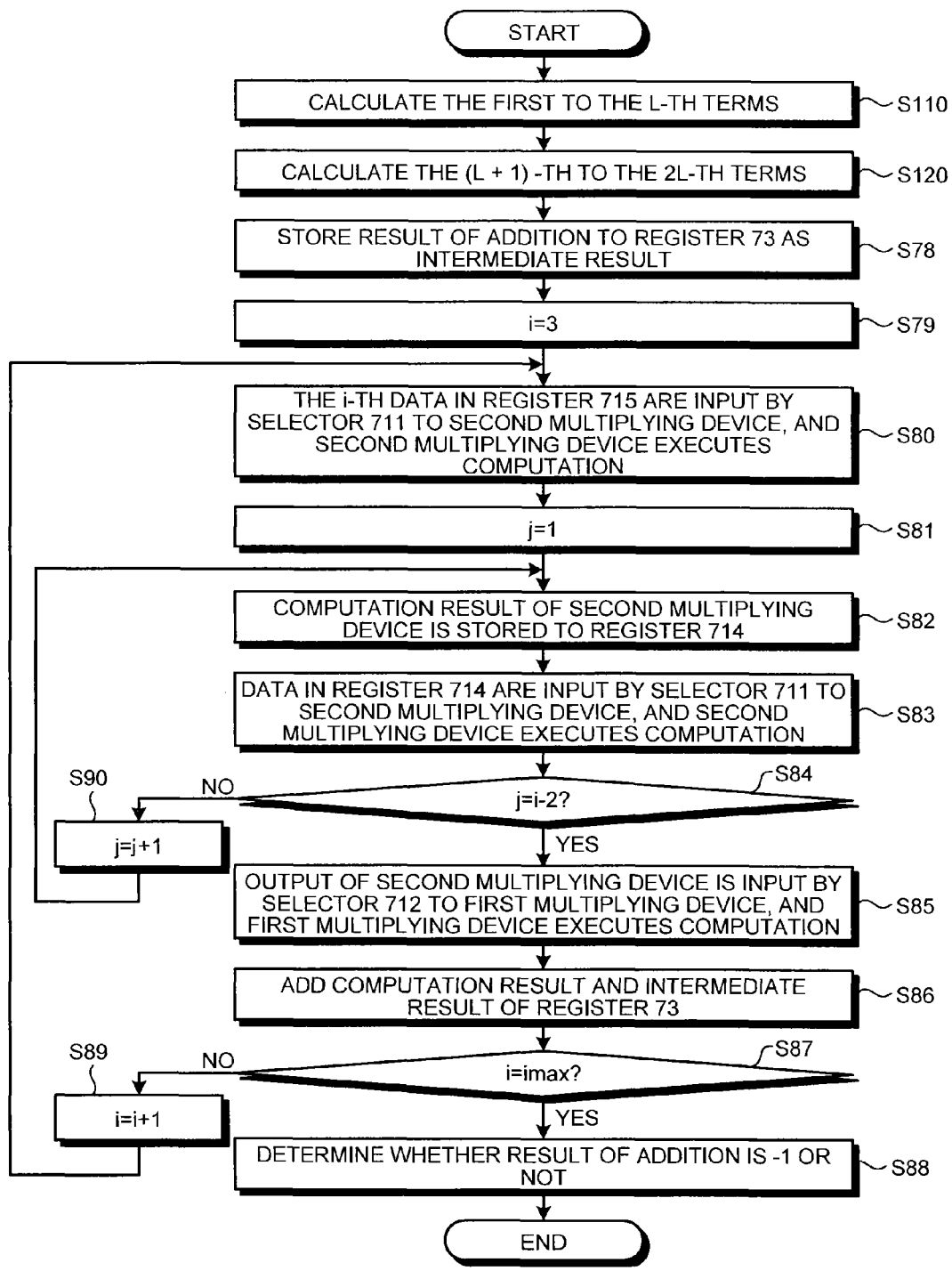
FIG. 24 is a figure illustrating an example of processing procedure of the Chien search where $2L<Y$ holds.

Subsequently, operation of the Chien search unit 263 when the number of terms Y in the error locator polynomial is more than 2L (2L<Y) will be explained. FIG. 24 is a figure illustrating an example of processing procedure of the Chien search where 2L<Y holds. In this case, each of the computing devices 710-1 to 710-L calculates imax−1 terms or imax terms. It should be noted that imax is an integer obtained by rounding up the fractional part of Y/L, and imax≥3 holds. When Y"=Y−(imax−1)×L holds, each of all the computing devices 710-1 to 710-L calculates (imax−1) terms, and thereafter, the computing devices 710-1 to 710-Y" further calculate one more term.

The decoding control unit 265 obtains imax and Y" on the basis of the number of terms Y in the error locator polynomial, and uses all the computing devices 710-1 to 710-L to respectively execute calculation of the first and second terms (steps S110, S120), and thereafter, executes calculation from the third term to imax-th term.

First, like the case of L<Y≤2L, the first and second terms are calculated (steps S110, S120). After step S120, the decoding control unit 265 stores the result added by the adding device 72 (the result of addition of the intermediate result and the second computation result of the computing devices 710-1 to 710-L) to the register 73 as an intermediate result (step S78).

The decoding control unit 265 sets the variable i representing the number of calculations to 3 (i=3) (step S79). The decoding control unit 265 starts calculating the i-th term, and the selector of each of the computing devices 710-1 to 710-L (where i is imax, the computing devices 710-1 to 710-Y") selects the register 715 as an input, and the i-th data stored in the register 715 are input to the second multiplying device (multiplying device 716), and the second multiplying device performs multiplication by $\alpha^L$ (step S80). Subsequently, the decoding control unit 265 sets a counter j, representing the number of repeated multiplications by $\alpha^L$, to 1 (j=1) (step S81), and the computation result of the second multiplying device is stored to the register 714 (step S82).

The selector 711 selects the register 714 as an input. The data stored in the register 714 (data stored in step S82) are input to the second multiplying device, and the second multiplying device performs multiplication by $\alpha^L$ (step S83). The decoding control unit 265 determines whether j=i−2 holds (step S84). When j=i−2 holds (step S84, Yes), the selector 712 inputs the computation result of the second multiplying device into the first multiplying device, and the first multiplying device performs computation (step S85). The value of the register 715 is updated with the computation result by the first multiplying device. Then, the adding device 72 executes addition (ExOR computation) of the intermediate result stored in the register 73 and the computation result of the first multiplying device (step S86). Thereafter, the decoding control unit 265 determines whether I=imax holds or not (step S87). When i=imax holds (step S87, Yes), the decoding control unit 265 determines whether there is any error in each bit according to whether the result of addition is −1 or not (step S88), and the processing is terminated.

In step S87, when i=imax does not hold (step S87, No), the result of addition is stored to the register 73 as an intermediate result, and i is increased by one (step S89). Then, step S80 is subsequently performed. When j=i−2 does not hold in step S84 (step S84, No), j is increased by one (step S90), and step S82 is subsequently performed.

According to the above operation, for example, when imax=3 holds, the computing device 710-i (i=1, 2, ... Y") calculates up to the second term, and thereafter, executes each of the following computations once: multiplication by $\alpha^L$ in step S80, multiplication by $\alpha^L$ in step S83, and multiplication by $\alpha^i$ in step S85. As a result, multiplication by $\alpha^{2L+i}$ is executed. When imax is 4, up to the third terms are calculated, and thereafter, the following computations are further executed: multiplication by $\alpha^L$ in step S80, multiplication by $\alpha^L$ twice in step S83, and multiplication by $\alpha^i$ in step S85. As a result, multiplication by $\alpha^{3L+i}$ is executed.

In this case, the example in which the multiplying device 713 for multiplication by $\alpha^L$ is provided has been explained. Alternatively, a multiplying device for multiplication by a constant other than $\alpha^L$ may be provided. Still alternatively, a plurality of multiplying devices for multiplication by a constant may be provided to perform multiplication in combination. For example, a multiplying device for multiplication by $\alpha^L$ and a multiplying device 2L for multiplication by $\alpha^{2L}$ be provided, and multiplication may be executed using a combination of multiplying devices for multiplications by different constants, for example, when multiplication by $\alpha^{L+i}$ (i=1, 2, ..., L) is performed, a multiplying device for multiplication by $\alpha^L$ is used, and when multiplication by $\alpha^{2L+i}$ (i=1, 2, ..., L) is performed, a multiplying device for multiplication by $\alpha^{2L}$ is used.

As described above, in the present embodiment, multiplication by $\alpha^L$ is repeatedly executed in accordance with the number of terms in the error locator polynomial, so that multiplication by any given constant can be achieved. In addition, it is not necessary to change the number by which the multiplying device performs multiplication in accordance with the number of terms in the error locator polynomial.

Therefore, while reduction of the speed of the computation is suppressed, and calculation of the Chien search of any given number of terms can be achieved with a less number of computing devices.

Fourth Embodiment

Subsequently, decoding processing according to a fourth embodiment will be explained. The configuration of a semiconductor storage device 1 according to the present embodiment is the same as that of the first embodiment. Constituent elements having the same functions as those of the first embodiment are denoted with the same reference numerals as those of the first embodiment, and repeated description thereabout is omitted.

In the third embodiment, the example in which the computation circuits of the Chien search unit 263 are reduced has been explained, but in the present embodiment, an example to which a decoding method capable of reducing the circuit size of not only the Chien search unit 263 but also the other units is applied will be explained.

The present embodiment is like the first embodiment, and in the present embodiment, attention is paid to the fact that, in average, the number of error bits included in a code word to be subjected to actual decoding (error correction decoding) is less than the maximum number of bits of error correction which can be corrected in a code word (which may be hereinafter referred to as the maximum number of correction bits). Accordingly, decoding processing is performed upon setting bits less than the maximum number of correction bits as an error number expectation value, and the error detection code decoder 264 checks whether the decoding has been done correctly or not. When correction could not be made by this decoding processing, the error number expectation value is increased, and the calculation is performed again. Further, when correction could not be made correctly even by this decoding processing, the error number expectation value is increased, and the calculations from the syndrome computation to the error detection code decoding are performed again. In this manner, the setting of the error number expectation value, the decoding processing, and the checking of the decoding result are repeated until the data are corrected, and when correction could not be made correctly even if the error number expectation value is set at the maximum number of correction bits, it is determined that the correction is impossible.

The entire processing of the decoding method according to the present embodiment is the same as the processing according to the first embodiment explained in FIG. 9. It should be noted that the write operation to the semiconductor memory unit 3 and operation during reading from the semiconductor memory unit 3 other than in the decoding processing are the same as the first embodiment. In the third embodiment, attachment of the error detection code may not be executed, but in the present embodiment, it is assumed that the error detection code is attached.

The syndrome computation procedure according to the present embodiment is the same as the procedure of the first embodiment explained in FIG. 11, and the error locator polynomial computation according to the present embodiment is the same as the procedure of the first embodiment explained in FIGS. 13, 14.

The calculation procedure of the Chien search according to the present embodiment is the same as the third embodiment, but when L is A, the number of terms in the error locator polynomial is equal to or less than L in the calculation of the first cycle, and therefore, operation of the first embodiment where Y is equal to or less than L is executed. In the calculation of the second cycle, operation of L≤Y≤2L (FIG. 23) is executed, and in the third and subsequent cycles, operation of 2L<Y (FIG. 24) is executed.

As described above, in the present embodiment, not only the Chien search unit 263 but also the syndrome computation unit 261 and the error locator polynomial computation unit 262 use computation circuits corresponding to the number of bits less than the maximum number of correction bits to execute decoding processing while updating the expected error number in units of A bits. Then, until the error correction is done correctly, or until the error number expectation value is set as the maximum number of correction bits, the error number expectation value is updated and the error correction processing is repeated. Therefore, the circuits in the decoding unit can be greatly reduced as compared with a case where as many computation circuits as the maximum number of correction bits are provided. In addition, the average speed of the decoding processing can be improved.

Fifth Embodiment

Figure 25:
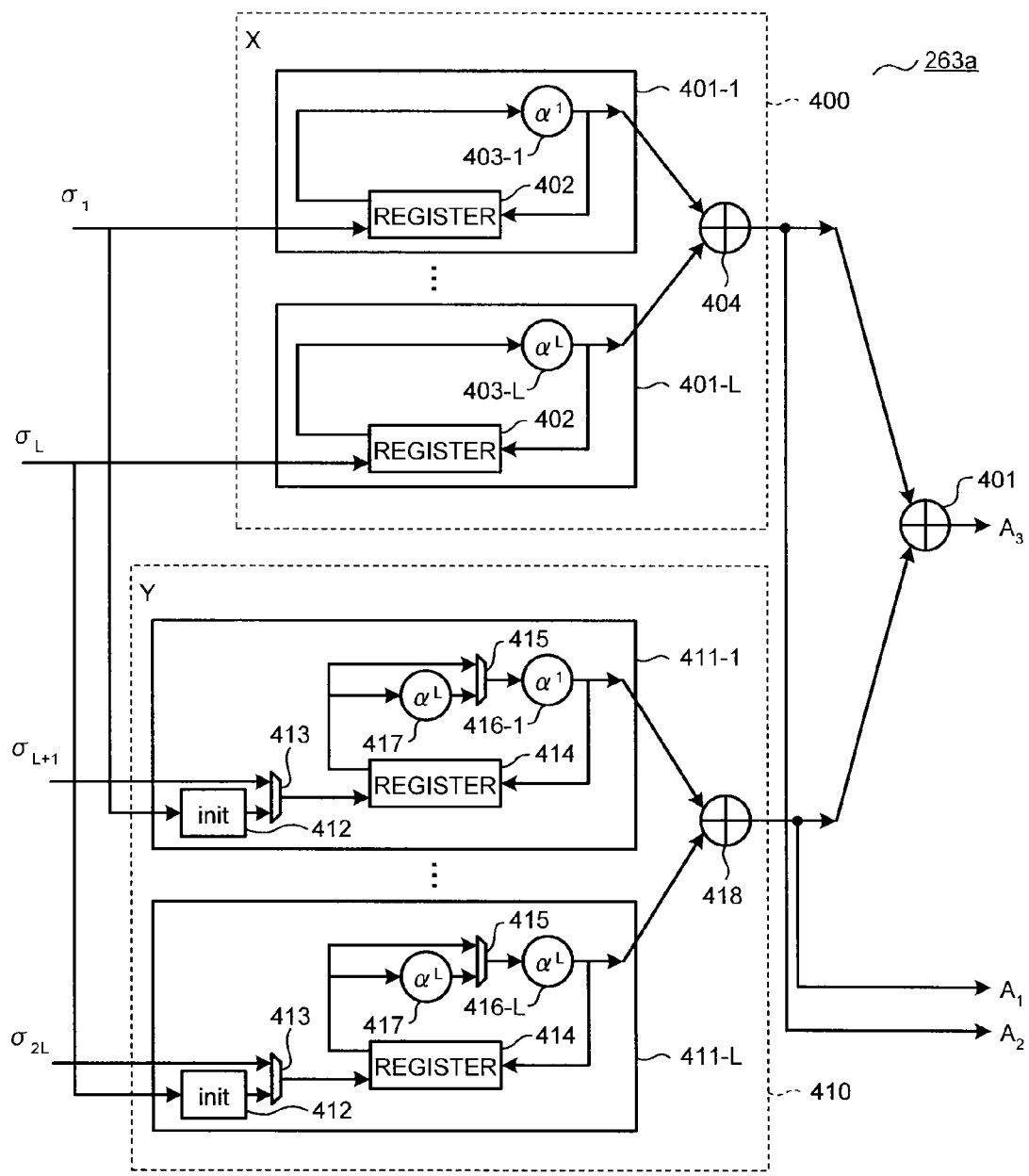
FIG. 25 is a block diagram illustrating an example of configuration of a Chien search unit according to a fifth embodiment.

FIG. 25 is a block diagram illustrating an example of configuration of a Chien search unit 263a according to a fifth embodiment. A semiconductor storage device according to the present embodiment is the same as the configuration of the semiconductor storage device 1 according to the third embodiment except that the Chien search unit 263 of the third embodiment is replaced with the Chien search unit 263a. Constituent elements having the same functions as those of the third embodiment are denoted with the same reference numerals as those of the third embodiment, and repeated description thereabout is omitted.

The Chien search unit 263a according to the present embodiment includes a first computation unit (first calculation unit) 400, a second computation unit (second calculation unit) 410, and an adding device (adder, adding unit) 401. The write operation to the semiconductor memory unit 3 according to the present embodiment and operation during reading from the semiconductor memory unit 3 including the decoding processing other than the Chien search are the same as the third or fourth embodiment.

As illustrated in FIG. 25, the first computation unit 400 includes computing devices 401-1 to 401-L and an adding device 404. The computing device 401-*i* (i=1, 2, . . . , L) includes a register 402 and a multiplying device 403-*i* for multiplication by $\alpha^i$. The second computation unit 410 includes computing devices 411-1 to 411-L and an adding device 418. The computing device 411-*i* (i=1, 2, . . . , L) includes an initial value calculating circuit (initial value calculator, initial value calculating unit, initial value calculating module) 412, a selector 413, a register 414, a selector 415, a multiplying device 416-*i* for multiplication by $\alpha^i$, and a multiplying device 417 for multiplication by $\alpha^L$.

In the present embodiment, when the number of terms obtained from the error locator polynomial computation (the number of error bits) Y is equal to or less than L, each of the first computation unit 400 and the second computation unit 410 sets a search target range of solution as a different range, and performs computation (hereinafter referred to as parallel computation). On the other hand, when Y is more than L, both of the first computation unit 400 and the second computation unit 410 are used to perform computation in all the search target range of solution (hereinafter referred to as series computation). The decoding control unit 265 determines which of the parallel computation and the series computation is performed in accordance with the number of terms obtained from the error locator polynomial computation, and on the basis of the determined result, the decoding control unit 265 controls the selectors and the like in the first computation unit 400 and the second computation unit 410.

Figure 26:
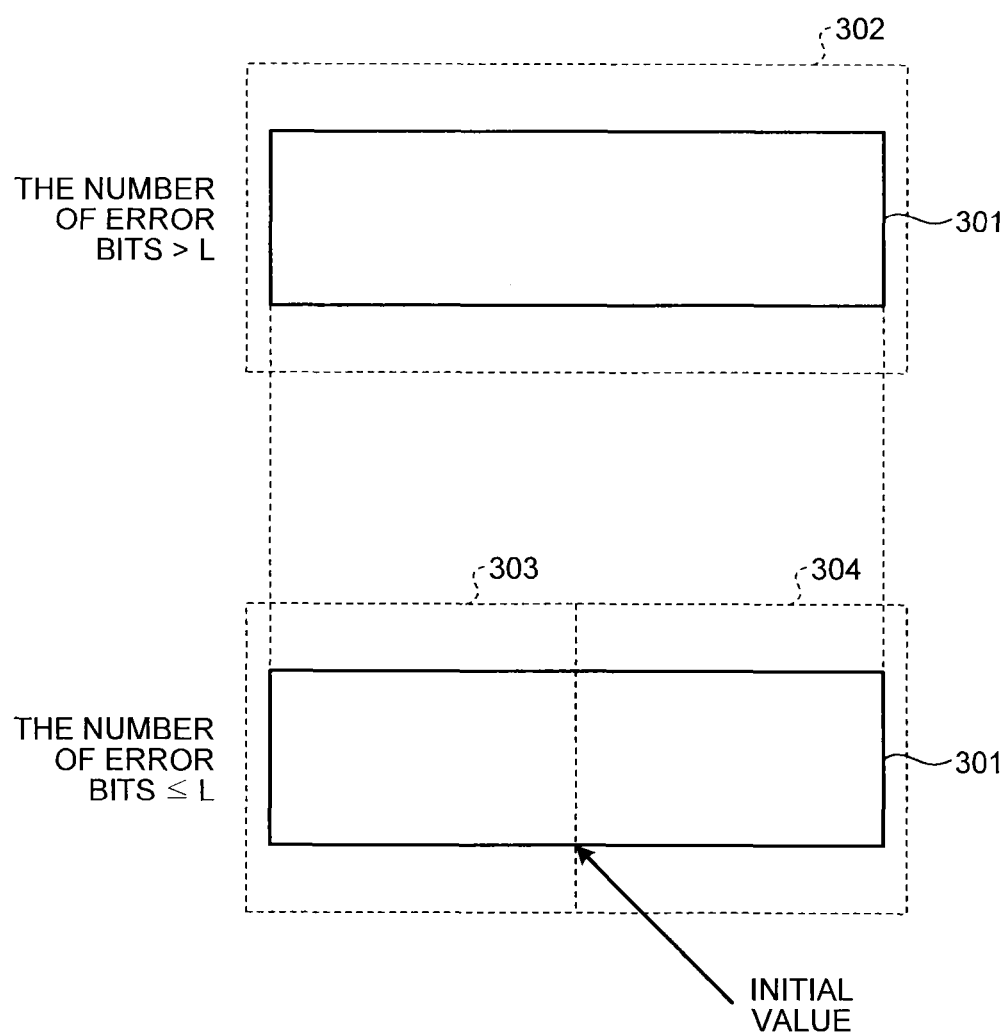
FIG. 26 is a figure illustrating a concept of parallel computation according to the fifth embodiment.

FIG. 26 is a figure illustrating a concept of parallel computation according to the present embodiment. With respect to the entire range 301 in which solution is searched, when the number of error bits is more than L as illustrated in the upper stage, the first computation unit 400 and the second computation unit 410 execute the Chien search while the entire range 301 is adopted as a search target range 302. In contrast, when the number of error bits is equal to or less than L as illustrated in the lower stage, the entire range 301 is divided into two divided ranges 303, 304. Then, the search range of solution of the first computation unit 400 is set as the divided range 303, and the search range of solution of the second computation unit 410 is set as the divided range 304. At this occasion, the calculation start of the second computation unit 410 (initial value) is not the start position of the entire range 301 but is the start position of the divided range 304. For this reason, the second computation unit 410 includes an initial value calculating circuit 412 for calculating the initial value. When search is started from half the position W/2 of the code word W, the initial value calculating circuit 412 of the computing device 411-1 calculates $\sigma_1 * (\alpha^1)^{(W/2)}$. Likewise, the initial value calculating circuit 412 of the computing device 411-L calculates $\sigma_L * (\alpha^L)^{(W/2)}$.

The operation of the first computation unit 400 is the same no matter whether the number of error bits is equal to or less than L or the number of error bits is more than L. When the number of error bits is equal to or more than L, 400-1 to 400-L are used to execute the computation. When the number of error bits Y is less than L, 400-1 to 400-Y are used to execute the computation. More specifically, the decoding control unit 265 stores the coefficient obtained from the error locator polynomial computation to the register 402. The multiplying devices 403-1 to 403-L execute the computation, and the adding device 404 adds this computation result. When the number of error bits is equal to or less than L, the decoding control unit 265 determines whether there is any error in each bit or not, using a result of addition $A_1$ of the adding device 404 and a result of addition $A_2$ explained later. When the number of error bits is more than L, the result of addition of the adding device 404 is input into the adding device 401. The adding device 401 adds the input provided by the adding device 404 and the input provided by the adding device 418, and outputs a result $A_3$. In this case, the decoding control unit 265 determines whether there is any error in each bit or not, using $A_3$.

The operation of the second computation unit 410 is different according to whether the number of error bits is equal to or less than L or the number of error bits is more than L. First, a case where the number of error bits Y is more than L will be explained. In accordance with the control of the decoding control unit 265, the selector 413 of 400-i (i=1, 2, . . . , Y-L) selects a coefficient $(\sigma_{L+1}, \ldots, \sigma_Y)$ in the error locator polynomial as a source of input, and stores the input coefficient to the register 414. The coefficient stored in the register 414 is input to the multiplying device 417, and the multiplying device 417 executes multiplication by $\alpha^L$. The selector 415 selects the multiplying device 417 as a source of input, and the computation result of the multiplying device 417 is input into 416-i (i=1, 2, . . . , Y-L). Then, 416-i (i=1, 2, . . . , Y-L) performs multiplication by $\alpha^i$. The adding device 418 adds the computation results of 416-1 to 416-(Y-L), and inputs the result of addition $A_2$ into the adding device 401. As described above, the adding device 401 outputs a result $A_3$ obtained by adding the input provided by the adding device 404 and the input provided by the adding device 418. The decoding control unit 265 determines whether there is any error in each bit or not, using $A_3$.

When the number of error bits is equal to or less than L, the decoding control unit 265 respectively inputs coefficient $(\sigma_1, \ldots, \sigma_Y)$ of the error locator polynomial corresponding to the initial value calculating circuit 412. In accordance with the control of the decoding control unit 265, the selector 413 selects the initial value calculating circuit 412 as a source of input, and the initial value calculated by the initial value calculating circuit 412 is stored to the register 414. The selector 415 selects the register 414 as a source of input, and the data stored in the register 414 are input into 416-(i=1, 2, . . . , Y-L). Then, 416-i (i=1, 2, . . . , Y-L) performs multiplication by $\alpha^i$. The adding device 418 adds the computation results of 416-1 to 416-(Y-L), and obtains the result of addition $A_2$. The decoding control unit 265 determines whether there is any error in each bit or not, using the result of addition $A_1$ and the result of addition $A_2$ In the explanation about the present embodiment, the search range of solution is divided into two parts, for example. Alternatively, three or more computation units may be provided, and the search range of solution may be divided into three or more parts.

As described above, in the present embodiment, the first computation unit 400 and the second computation unit 410 are provided. When the number of error bits is more than the number of computing devices provided in the first computation unit 400, the second computation unit 410 having the multiplying device 417 executing multiplication by $\alpha^L$ calculates the (L+1)-th term and subsequent terms. On the other hand, when the number of error bits is equal to or less than the number of computing devices provided in the first computation unit 400, the search range of solution may be divided, so that the first computation unit 400 and the second computation unit 410 search different ranges. Therefore, the number of error bits equivalent to the total number of computing devices provided in the first computation unit 400 and the second computation unit 410 can be supported, and when the number of error bits is less, the parallel computation can be executed, and the speed of the computation can be improved.

Sixth Embodiment

Figure 27:
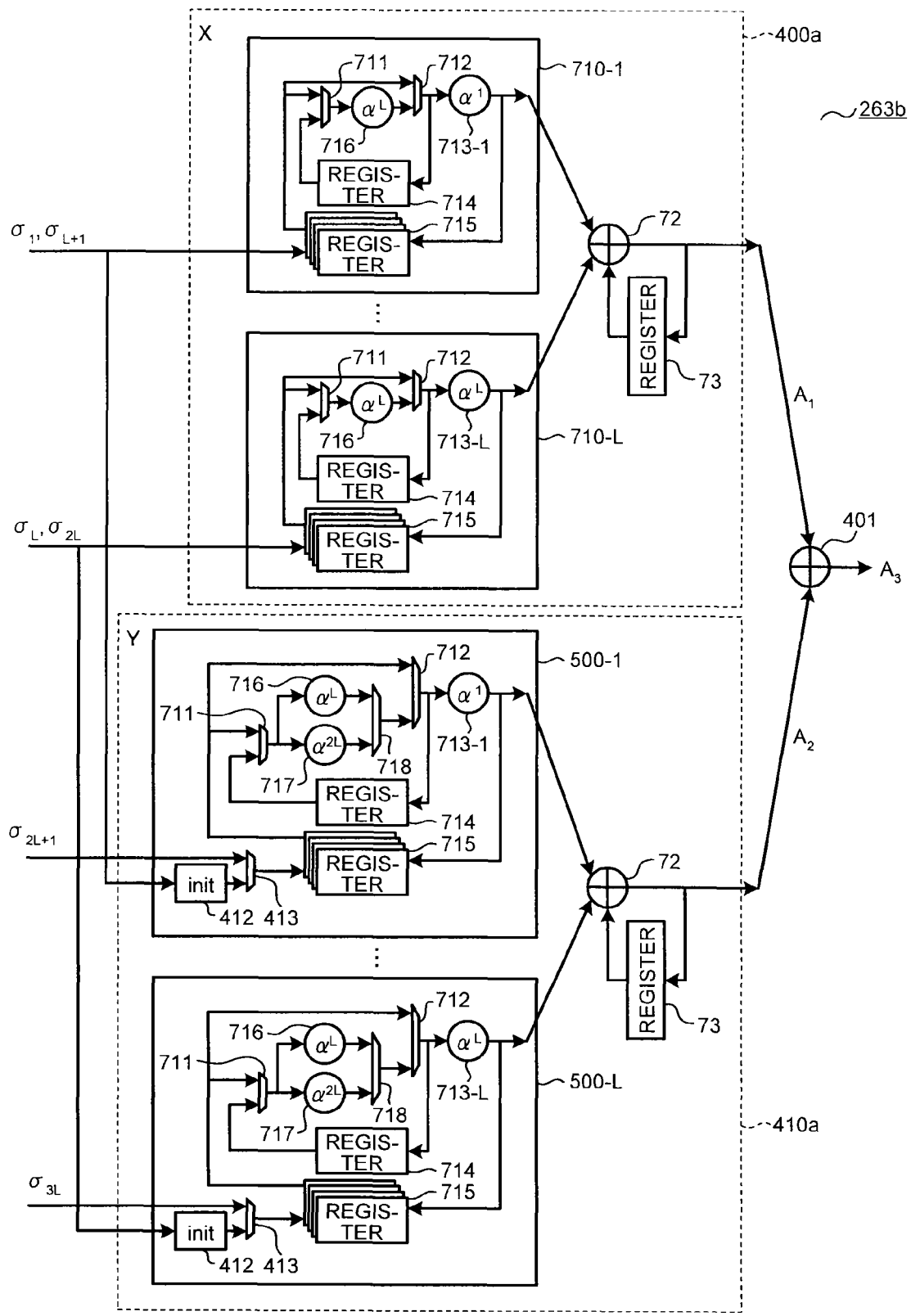
FIG. 27 is a block diagram illustrating an example of configuration of a Chien search unit according to a sixth embodiment.

FIG. 27 is a block diagram illustrating an example of configuration of a Chien search unit 263b according to a sixth embodiment. A semiconductor storage device according to the present embodiment is the same as the configuration of the semiconductor storage device 1 according to the third embodiment except that the Chien search unit 263 of the third embodiment is replaced with the Chien search unit 263b. Constituent elements having the same functions as those of the third embodiment are denoted with the same reference numerals as those of the third embodiment, and repeated description thereabout is omitted.

The Chien search unit 263b according to the present embodiment includes a first computation unit 400a, a second computation unit 410a, and an adding device 401. The write operation to the semiconductor memory unit 3 according to the present embodiment and operation during reading from the semiconductor memory unit 3 including the decoding processing other than the Chien search are the same as the third or fourth embodiments.

Like the fifth embodiment, the present embodiment is configured such that, in accordance with the number of terms Y obtained from the error locator polynomial computation, the first computation unit 400a and the second computation unit 410a are used either in series or in parallel. Therefore, while the present embodiment supports a case where the number of error bits is large, high-speed processing can be achieved when the number of error bits is less.

The first computation unit 400a includes computing devices 710-1 to 710-L, which are the same as those of the third embodiment, an adding device 72, and a register 73. The second computation unit 410a includes computing devices 500-1 to 500-L, an adding device 72, and a register 73. The computing device 500-$i$ (i=1, 2, . . . , L) is the same as the computing device 710-$i$ except that the computing device 500-$i$ (i=1, 2, . . . , L) additionally includes a multiplying device 717 for multiplication by $\alpha^{2L}$ and a selector 718 for selecting any one of an output of a multiplying device 716 and the output of the multiplying device 717 and outputting the selected output to a selector 712, and additionally includes an initial value calculating circuit 412 and a selector 413 which are the same as those of the third embodiment.

In the present embodiment, when the number of terms obtained from the error locator polynomial computation is equal to or less than 2L, each of the first computation unit 400a and the second computation unit 410a sets a search target range of solution as a different range, and performs computation. On the other hand, when Y is more than 2L, both of the first computation unit 400a and the second computation unit 410a are used to perform the Chien search.

When the number of terms Y obtained from the error locator polynomial computation is equal to or less than L, the computing devices 710-1 to 710-L of the first computation unit 400a and the computing devices 500-1 to 500-L of the second computation unit 410a execute, in parallel, the same operation as the operation of the first embodiment where Y is equal to or less than L. When the number of terms Y obtained from the error locator polynomial computation is more than L, the same operation as the first embodiment where L<Y≤2L holds is performed. At this occasion, in the computing devices 500-1 to 500-L of the second computation unit 410a, the selector 718 selects the output of the multiplying device 716 and outputs the selected output to the selector 712.

When 2L<Y holds, the operation of the computing devices 710-1 to 710-L of the first computation unit 400a is the same as the operation where Y=2L holds. In a case where 2L<Y holds, the computing devices 500-1 to 500-L of the second computation unit 410a use the multiplying device 717 instead of the multiplying device 716 (the selector 718 selects the multiplying device 717), and the same operation as the operation of the first embodiment where L<Y≤2L holds is performed, so that multiplication by $\alpha^{2L+1}$ to $\alpha^{3L}$ can be performed respectively. In a cycle subsequent to the multiplication using the multiplying device 717, multiplication is performed using the multiplying device 716, so that multiplication by $\alpha^{3L+1}$ to $\alpha^{4L}$ can be performed. The decoding control unit 265 determines whether there is any error in each bit or not, using the result of addition $A_3$ of the result of addition $A_1$ which is output from the first computation unit 400a and the result of addition $A_2$ which is output from the second computation unit 410a.

It should be noted that a case where Y>4L can also be supported when the computing devices 500-1 to 500-L of the second computation unit 410a use the multiplying device 716 or the multiplying device 717 to perform computation for performing repeated multiplications.

When the number of terms obtained from the error locator polynomial computation is equal to or less than 2L, the first computation unit 400a and the second computation unit 410a are used to execute the parallel computation like the third embodiment. In this case, in the computing device 500-$i$ (i=1, 2, . . . , L), the selector 413 selects the initial value calculating circuit 412 as a source of input, and the initial value which is output from the initial value calculating circuit 412 is stored to the register 715. Then, the selector 712 selects the value read from the register 715, and inputs the value into the multiplying device 713-$i$. The decoding control unit 265 determines whether there is any error in each bit or not, using the result of addition $A_1$ and the result of addition $A_2$.

Alternatively, three or more computation units may be provided, and the search range of solution may be divided into three or more parts during the parallel computation. In this case, for example, the third computation unit includes the multiplying device 716 and the multiplying device for multiplication by $\alpha^{3L}$. During the parallel computation, the multiplying device 716 is used. During the series computation, the multiplying device for multiplication by $\alpha^{3L}$ is used.

In the above example, in the second computing device 410a, the multiplying device 717 for multiplication by $\alpha^{2L}$ is used to perform multiplication by $\alpha^{2L}$. Alternatively, instead of providing the multiplying device 717, multiplication by $\alpha^{2L}$ may be performed using the multiplying device 716 for multiplication by $\alpha^{L}$ and the register 714 as explained in the first embodiment.

As described above, in the present embodiment, the same computing device as the third embodiment is used to perform the series computation or the parallel computation in accordance with the number of terms obtained from the error locator polynomial computation. Therefore, the case where the number of error bits is large can be supported, and when the number of error bits is less, the parallel computation can be executed, and the speed of the computation can be improved.

Seventh Embodiment

Figure 28:
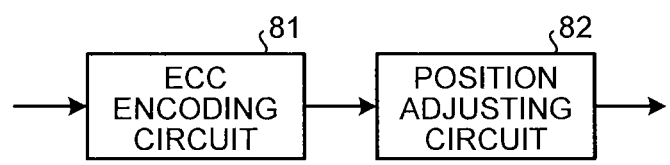
FIG. 28 is a block diagram illustrating an example of configuration of an encoding device according to a seventh embodiment.

FIG. 28 is a block diagram illustrating an example of configuration of an encoding device according to a seventh embodiment. As illustrated in FIG. 28, an encoding device according to the present embodiment includes an ECC (Error Checking and Correction) encoding circuit (encoder, encoding unit, encoding module) 81 and a position adjusting circuit (position adjuster, position adjusting unit, position adjusting module) 82.

In the present embodiment, an example where a BCH code is used as a code generated by an encoding device will be explained. The code generated by the encoding device may be another error correction code such as Reed-Solomon code (RS code), or may be an error detection code such as CRC (Cyclic Redundancy Check). The code generated by the encoding device is not limited to the BCH code.

In order to keep consistency with an input order to a decoding device during decoding, data are input in a determined order into an encoding device according to the comparative example, and the data are encoded. For example, when one piece of encoding target data (encoding data) includes a plurality of data blocks, it is necessary to input the data blocks in the determined order. Therefore, when the order in which the data blocks are received is different from the input order into the encoding device, the received data blocks are stored to a buffer. Then, the data blocks are sorted in the input order, and are input into the encoding device. Therefore, it is necessary to have the buffer, and the speed of the encoding processing is reduced.

Figure 29:
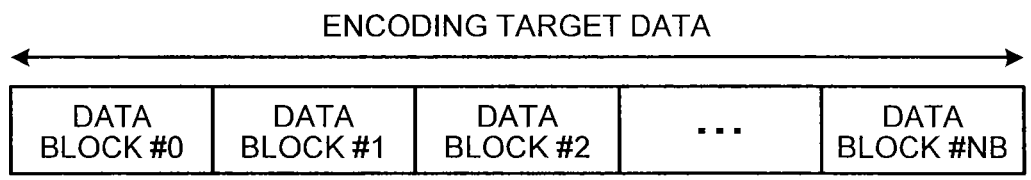
FIG. 29 is a figure illustrating an example of data configuration in a case where encoding target data include a plurality of data blocks.

FIG. 29 is a figure illustrating an example of data configuration in a case where encoding target data includes a plurality of data blocks. In the example of FIG. 29, the encoding target data include NB+1 data blocks from a data block #0 to a data block #NB (NB is an integer equal to or more than one). When a code word is generated on the basis of the encoding target data as illustrated in FIG. 29, in general, data are input into the encoding device in a predetermined order, for example, the data block #0, the data block #1, the data block #2, . . . , so as to be consistent with the data input order during decoding. Even when data are not input into the encoding device in the predetermined order, the data are input into the decoding device in the predetermined order, and as a result, the input order of the data during encoding is different from the input order of the data during decoding, which makes it impossible to correctly decode the data. It may be possible to manage the input order of data into the encoding device, and the decoding device may change the input order for each piece of encoding target data, but in this case, the data to be managed are enormous, and the speed of the processing decreases.

Figure 30:
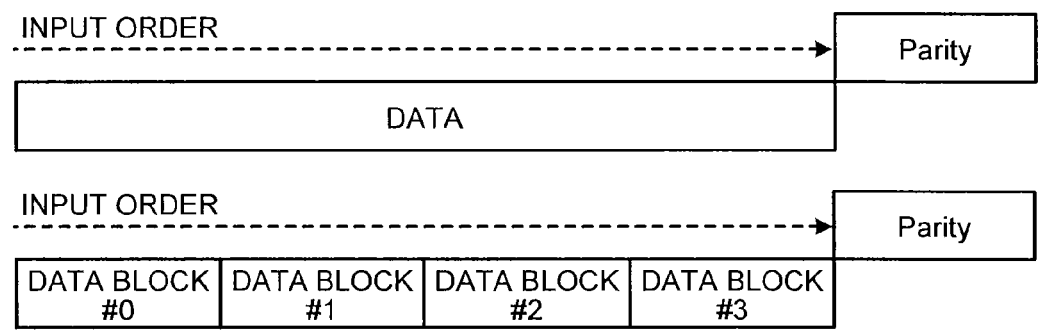
FIG. 30 is a figure illustrating an example of data input order in an encoding decoding system using an encoding device according to a comparative example.
Figure 30:
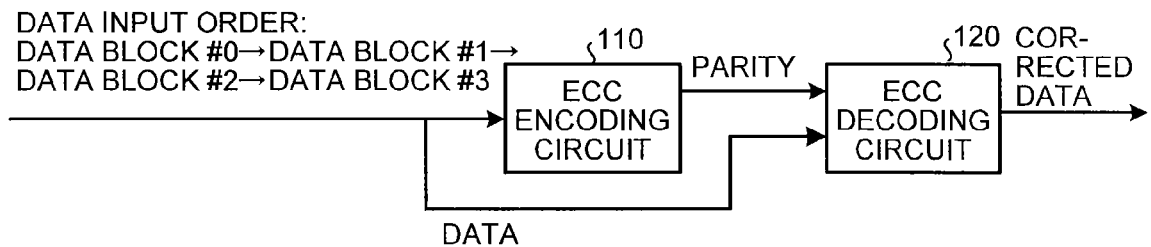
Figure 31:
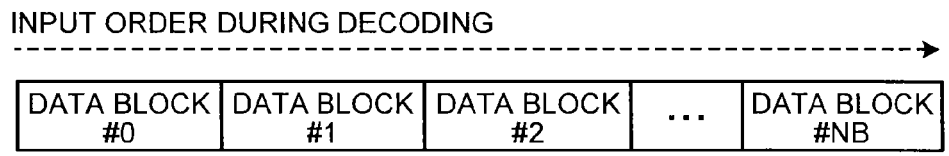
FIG. 31 is a figure illustrating an example of input order of data into an ECC decoding circuit.

FIG. 30 is a figure illustrating an example of data input order in an encoding decoding system using an encoding device according to a comparative example. FIG. 30 is a figure illustrating an example of data input order in an ECC encoding circuit 110 which is an encoding device according to the comparative example. In FIG. 30, for the sake of simplifying the figure, NB is set as 3, and FIG. 30 illustrates an example of data input order (the order is as follows: the data block #0, the data block #1, the data block #2, and the data block #3) in a case where the encoding target data include NB+1 data blocks. The ECC decoding circuit 120 performs decoding processing on the basis of data and parities generated by the ECC encoding circuit 110. At this occasion, the input order of data into the ECC decoding circuit 120 is the same as the input order of data into the ECC encoding circuit 110. FIG. 31 is a figure illustrating an example of input order of data into an ECC decoding circuit 120. FIG. 31 illustrates an input order of data into the ECC decoding circuit 120 in a case where data are input in the input order as illustrated in FIG. 30 in encoding processing.

For example, in the example of data configuration of FIG. 29, it is defined that decoding is performed in the following order: the data block #0, the data block #1, the data block #2, the data block #3. In this case, for example, the encoding device is assumed to receive the data block #3 before receiving the data blocks #0, #1, #2.

For example, in the example of configuration of the comparative example as illustrated in FIG. 30, the ECC encoding circuit 110 is assumed to receive the data block #3 before receiving the data blocks #1, #2. In this case, the ECC encoding circuit 110 cannot input the data block #3 before inputting the data blocks #0, #1, #2, and therefore, the ECC encoding circuit 110 has to wait while holding the data block #3 until the ECC encoding circuit 110 receives the data blocks #0, #1, #2.

In contrast, if the data block #3 can be input and encoded before the data blocks #0, #1, #2 are input, then it is not necessary to hold the data block #3, and it is not necessary to wait for the start of encoding processing. For example, if the encoding processing can be performed using some data at any given position in the encoding target data, the data block #3 can be input in advance, and it is not necessary to wait for the start of encoding processing. However, if the encoding processing is simply performed using the data block #3, code words corresponding to the bits in the data for only the data block #3 is generated. Therefore, when the data block #3, then the data blocks #0, #1, and then the data block #2 are simply encoded in this order, NB+1 code words respectively corresponding to NB+1 data blocks in the encoding target data are generated, which cannot be decoded by the ECC decoding circuit 120 which performs decoding operation on the basis of the assumption that the entire encoding target data are encoded.

When there is no position adjusting function for performing encoding processing using some of data at any given position, the following two problems occur depending on the embodiment method.

(1) When NB+1 data blocks are respectively encoded, NB+1 code words respectively corresponding to NB+1 data blocks are simply generated, which cannot be unified into one code word.

(2) When NB+1 data blocks are encoded in a predetermined order (the parity of a data block which is input into the encoding circuit in advance is adopted as an intermediate result, which is used an initial value of parity calculation of a subsequent data block), one code word corresponding to only this order of the NB+1 data blocks is generated, and therefore, the NB+1 data blocks must be input into the decoding circuit in this order. On the contrary, there is dependency, i.e., when the input order of data into the decoding circuit is determined, the input order of data into the encoding circuit is determined.

In the present embodiment, the ECC encoding circuit 81 performs the encoding processing using some of data at any given position in the encoding target data. Then, the position adjusting circuit 82 performs position adjustment with respect to the parity generated in the encoding processing by the ECC encoding circuit 81, so as to allow correct decoding when decoding is performed on the basis of the assumption that the entire encoding target data have been encoded. When encoding is performed while some of data in the encoding target data are used as input, the position adjusting circuit 82 adjusts the bit position with respect to the parity generated in the encoding processing in accordance with the position in the encoding target data of the data. Therefore, for example, when the encoding processing is performed in an order different from the input order of the decoding processing, for example, when the data block #3, the data block #0, the data block #1, and then the data block #2 are encoded in this order, parities can be generated using the parities of the data blocks of which positions have been adjusted, so that decoding can be done in the decoding processing based on the assumption the entire encoding target data are encoded in a predetermined order. Hereinafter, the decoding processing based on the assumption the entire encoding target data are encoded in a predetermined order will be referred to as "regular decoding processing".

More specifically, for example, the position adjusting circuit 82 executes processing corresponding to input of "zero" into a portion of a code word generated by the ECC encoding circuit 81 where actual data do not exist in the encoding target data (hereinafter referred to as zero padding).

Hereinafter explained is why a parity that can be decoded by the parity can be generated by making the above position adjustment. In this explanation, the ECC encoding circuit 81 generates a cyclic code. Where information having k bits (corresponding to encoding target data of FIG. 29) is ($d_0$, $d_1$, . . . , $d_{k-1}$), a cyclic code having n bits ($c_0$, $c_{m-1}$, $d_0$, $d_1$, . . . , $d_{k-1}$) is generated. ($c_0$, $c_{m-1}$) are inspection bits (parities), and n=m+k holds.

In order to generate the cyclic code having n bits ($c_0$, $c_1$, . . . , $c_{m-1}$, $d_0$, $d_1$, . . . , $d_{k-1}$) division is performed using a generation polynomial G(x) as represented in the following expression (1). P(x) is a polynomial corresponding to information bits. F(x) is a polynomial corresponding to a cyclic code (code word).

$$F(x) = \frac{x^{n-k}P(x)}{G(x)} \quad (1)$$

The remainder $R(x)$ of the division as shown in the above expression (1) is a polynomial corresponding to inspection bits ($c_0, c_1, \ldots, c_{m-1}$). When the inspection bits are added to the information bits ($d_0, d_1, \ldots, d_{k-1}$), the cyclic code having n bits ($c_0, c_1, \ldots, c_{m-1}, d_0, d_1, \ldots, d_{k-1}$) can be obtained.

$F(x)$, $G(x)$, $R(x)$ can be represented by the following expression (2).

$$P(x) = d_0 + d_1 x + \ldots + d_{k-2} x^{k-2} + d_{k-1} x^{k-1} \quad (2)$$

$$G(x) = g_0 + g_1 x + \ldots + g_{m-1} x^{m-1} + g_m x^m$$

$$R(x) = c_0 + c_1 x + \ldots + c_{m-2} x^{m-2} + c_{m-1} x^{m-1}$$

$$F(x) = c_0 + c_1 x + \ldots + c_{m-2} x^{m-2} + c_{m-1} x^{m-1} + d_0 x^m + d_1 x^{m+1} + \ldots +$$

$$d_{k-2} x^{m+k-2} + d_{k-1} x^{m+k-1} = c_0 + c_1 x + \ldots + c_{m-2} x^{m-2} +$$

$$c_{m-1} x^{m-1} + d_0 x^m + d_1 x^{m+1} + \ldots + d_{n-2} x^{n-2} + d_{n-1} x^{n-1}$$

More specifically, when the product of the division of the above (1) is denoted as $Q(x)$, $F(x)$ can be represented by the following expression (3).

$$F(x) = G(x)Q(x) = x^{n-k}P(x) + R(x) \quad (3)$$

The information bits having k bits are divided into t data blocks, and the date blocks are denoted as the first data block, the second data block, . . . , which are named in order from the bit position corresponding to the term of the 0-th degree. In this case, the first data block has i bits, the total number of bits of the first and second data blocks is j bits, and the total number of bits of the first to the (t−1)-th data block is l bits. At this occasion, $P(x)$ is a summation of polynomials $P_1(x)$, $P_2(x)$, $P_3(x)$, . . . , $P_t(x)$ corresponding to the data blocks as shown in the following expression (4).

$$P_1(x) = d_0 + d_1 x + \ldots + d_{i-1} x^{i-1} + 0 x^i + \ldots + 0 x^{k-1}$$

$$P_2(x) = 0 + 0x + \ldots + 0 x^{i-1} + d_i x^i + \ldots + d_j x^j + 0 x^{j+1} + \ldots + 0 x^{k-1}$$

$$P_t(x) = 0 + 0x + \ldots + 0 x^{i-1} + d_l x^l + \ldots + d_{k-1} x^{k-1}$$

$$P(x) = P_1(x) + P_2(x) + \ldots + P_t(x) \quad (4)$$

As shown in the above expression (4), in the polynomials $P_1(x)$, $P_2(x)$, $P_3(x)$, . . . , $P_t(x)$ corresponding to the data blocks, the terms corresponding to the bit positions corresponding to the data blocks are multiplied by values corresponding to the information, but the other terms are multiplied by zero.

$F(x)$ can be made into the expression (5) using the above expressions (3), (4).

$$F(x) = G(x)Q(x) = x^{n-k}(P_1(x)P_2(x) + \ldots + P_t(x)) + R(x) \quad (5)$$

When the polynomials of the inspection bits corresponding to $P_1(x)$, $P_2(x)$, $P_3(x)$, . . . , $P_t(x)$ are respectively denoted as $R_1(x) + R_2(x) + R_3(x) + \ldots + R_t(x)$, the remainder of $\{R_1(x) + R_2(x) + R_3(x) + \ldots + R_t(x)\}/G(x)$ is $R(x)$ as shown below.

$Q(x)$ is the product of the above (1), and $R(x)$ is the remainder of the above (1), and therefore, the following expression (6) is obtained.

$$x^{n-k}P(x)/G(x) = Q(x) + R(x)/G(x) \quad (6)$$

The following expressions (7), (8) are obtained from the above expression (6) and the above expression (4).

$$x^{n-k}\{P_1(x) + P_2(x) + \ldots + P_t(x)\}/G(x) = Q(x) + R(x)/G(x) \quad (7)$$

$$x^{n-k}\{P1(x) + P_2(x) + \ldots + P_t(x)\}/G(x) = X^{n-k}P1(x)/G(x) + x^{n-k}P_2(x)/G(x) + \ldots + x^{n-k}Pt(x)/G(x) \quad (8)$$

When the product of $X^{n-k}Pi(x)/G(x)$ in the above expression (8) is denoted as $Q^i(x)$, and the remainder thereof is denoted as $R^i(x)$, the following expression (9) is satisfied.

$$x^{n-k}P_i(x)/G(x) = Q_i(x) + R_i(x)/G(x) \quad (9)$$

The following expressions (10), (11) are derived from the above expressions (7), (8), (9).

$$Q_1(x) + R_1(x)/G(x) + Q_2(x) + R_2(x)/G(x) + \ldots + Q_t(x) + R_t(x)/G(x) = x^{n-k}P(x)/G(x) = Q(x) + R(x)/G(x) \quad (10)$$

$$\{R_1(x) + R_2(x) + \ldots + R_t(x)\}/G(x) = Q(x) - Q_1(x) - Q_1(x) - \ldots - Q_t(x) + R(x)/G(x) \quad (11)$$

As shown in the above expression (11), the remainder of $\{R1(x) + R2(x) + R3(x) + \ldots + Rt(x)\}/G(x)$ is also $R(x)$.

The maximum degree of $R_1(x) + R_2(x) + R_3(x) + \ldots + R_t(x)$ is (m−1) which is the same degree as $R(x)$, and therefore, $R(x)$ is a summation (exclusive OR) of $R_1(x), R_2(x), R_3(x), \ldots, R_t(x)$ as shown in the following expression (12)

$$R_1(x) + R_2(x) + R_3(x) + \ldots + Rt(x) = R(x) \quad (12)$$

As described above, when $R1(x), R2(x), R3(x), \ldots, Rt(x)$ are obtained on the basis of $P1(x), P2(x), P3(x), \ldots, Pt(x)$, the inspection bits $R(x)$ corresponding to the information having k bits can be obtained. In view of the above facts, $R_1(x), R_2(x), R_3(x), \ldots, R_t(x)$ may be calculated in any order. Therefore, the computation can be performed by encoding in the order of reception of data blocks or encoding a plurality of data blocks in parallel.

In the present embodiment, first, the ECC encoding circuit 81 performs ordinary encoding processing based on the data length of each data block on the basis of each data block, and obtains inspection bits (parities) as an intermediate result. Then, the position adjusting circuit 82 generates, on the basis of the intermediate result, inspection bits corresponding to the inspection bits $R_1(x), R_2(x), R_3(x), \ldots, R_t(x)$ generated on the basis of $P_1(x), P_2(x), P_3(x), \ldots, P_t(x)$ as shown in the above expression (2). More specifically, processing corresponding to input of "zero" into bits corresponding to terms multiplied by zero is performed with $P_1(x), P_2(x), P_3(x), \ldots, P_t(x)$ as shown in the above expression (2). More specifically, this processing may be achieved with any circuit, and processing may be performed to input "zero" into bits corresponding to terms actually multiplied by zero, or the processing may be achieved by, for example, processing for shifting bits.

Even when only a portion of information (data) respectively corresponding to $P_1(x), P_2(x), P_3(x), \ldots, P_t(x)$ can be obtained ultimately, the position adjustment according to the present embodiment can be applied. For example, this corresponds to, for example, a case where, in FIG. 29, only the data block #3 is received, and data of the other data blocks are not received. Even in this case, $R_1(x), R_2(x), R_3(x), \ldots, R_t(x)$ are generated on the basis of $P_1(x), P_2(x), P_3(x), \ldots, P_t(x)$ corresponding to the data blocks in which information could be obtained, and $R(x)$ is obtained by adding the generated $R_1(x), R_2(x), R_3(x), \ldots, R_t(x)$ (when the generated $R_1(x), R_2(x), R_3(x), \ldots, R_t(x)$ is one, it is used as it is). Therefore, for example, even when data are stored to only some data blocks of encoding target data and are transmitted for the purpose of, e.g., compressing data, the data can be decoded in regular decoding processing just like the ordinary case.

Figure 32:
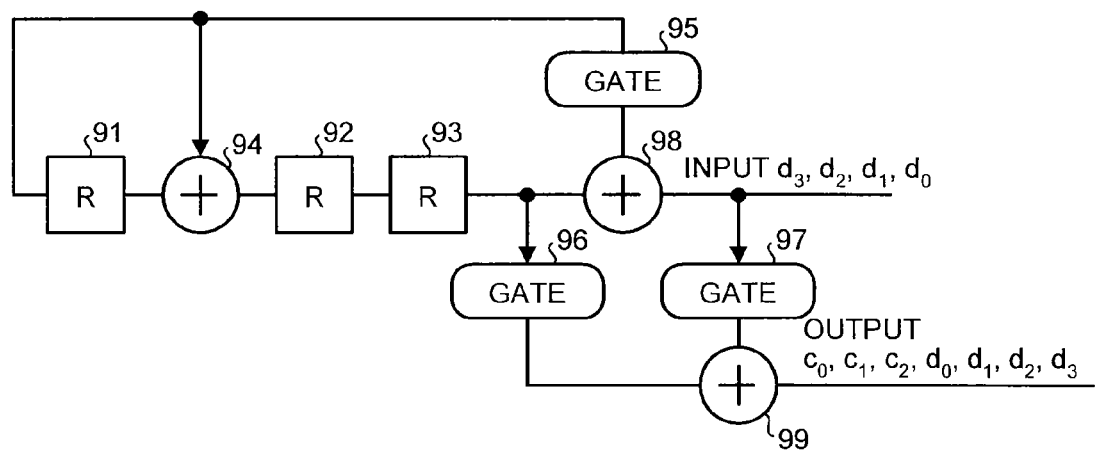
FIG. 32 is a figure illustrating an example of configuration of an ECC encoding processing circuit.

FIG. 32 is a figure illustrating an example of configuration of the ECC encoding processing circuit 81. FIG. 32 is an example of configuration of the ECC encoding processing circuit 81 in a case where the generation polynomial $G(x)=x^3+x+1$ is used. As illustrated in FIG. 32, the ECC encoding processing circuit 81 includes registers (R) 91, 92, 93, adding devices 94, 98, 99, and gates 95, 96, 97. FIG. 32 is an example, and the configuration of the ECC encoding processing circuit 81 and the generation polynomial are not limited to the example of FIG. 32.

Figure 33:
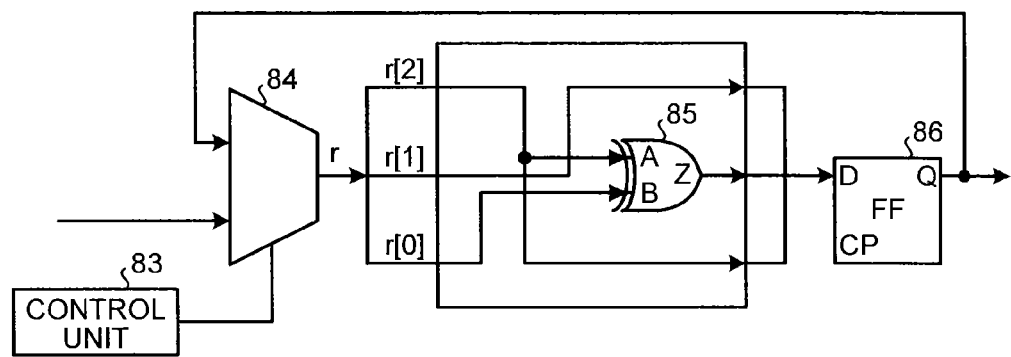
FIG. 33 is a figure illustrating an example of configuration of a position adjusting circuit.
Figure 34:
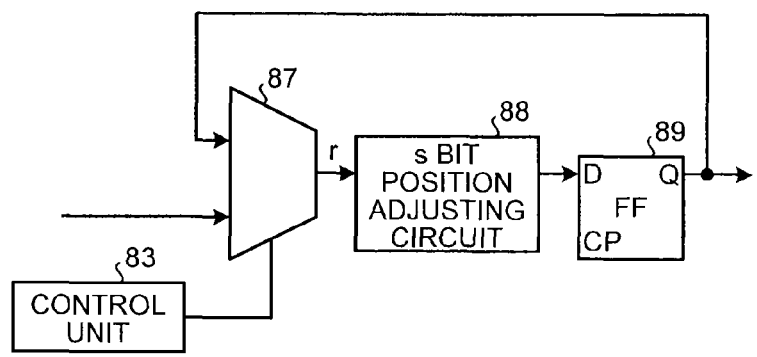
FIG. 34 is a figure illustrating an example of configuration of a position adjusting circuit.

FIG. 33, 34 are figures illustrating an example of configuration of the position adjusting circuit 82. In the above $P_1(x)$, $P_2(x)$, $P_3(x)$, ..., $P_l(x)$, bits of higher degrees than the bit position where actual information exists (for example, in $P_2(x)$, bits corresponding to terms from $x_{j+1}$ to $x_{k-1}$) and bits of lower degrees than the bit position where actual information exists (for example, in $P_2(x)$, bits corresponding to terms from $x_0$ to $x_{x-1}$) are zeros, but the same result can be obtained even when zeros are not input into bits of higher degrees than the bit position where actual information exists. Therefore, the example of configuration of FIGS. 33, 34 illustrates a configuration in which zeros are input into bits of higher degrees than the bit position where actual information exists. FIG. 33 shows an example where the parity has 3 bits.

In the example of configuration of FIG. 33, the position adjusting circuit 82 includes a selector 84, an XOR gate 85, and an FF (Flip Flop) 86. In the position adjusting circuit 82, the control unit 83 provided inside or outside controls the number of repetitions (one, two, or three) in accordance with the number of bits to be adjusted (the number of bits of higher degrees than the bit position where actual information exists, into which zeros are input). According to the control of the control unit 3, the selector 84 selects any one of the received intermediate result (the parity generated by the ECC encoding processing circuit 81) and the output of the FF 86, and outputs the selected one. In the first time, the intermediate result which is input into the selector 84 is selected, and as a result, one bit of "zero" is input. In the second and third times, the selector 84 selects the output of the FF 86. Therefore, in the second repetition, two bits can be input, and in the third repetition, three bits of "zeros" can be input. In this manner, the number of bits to be adjusted can be changed in accordance with the number of repetitions.

Figure 37:
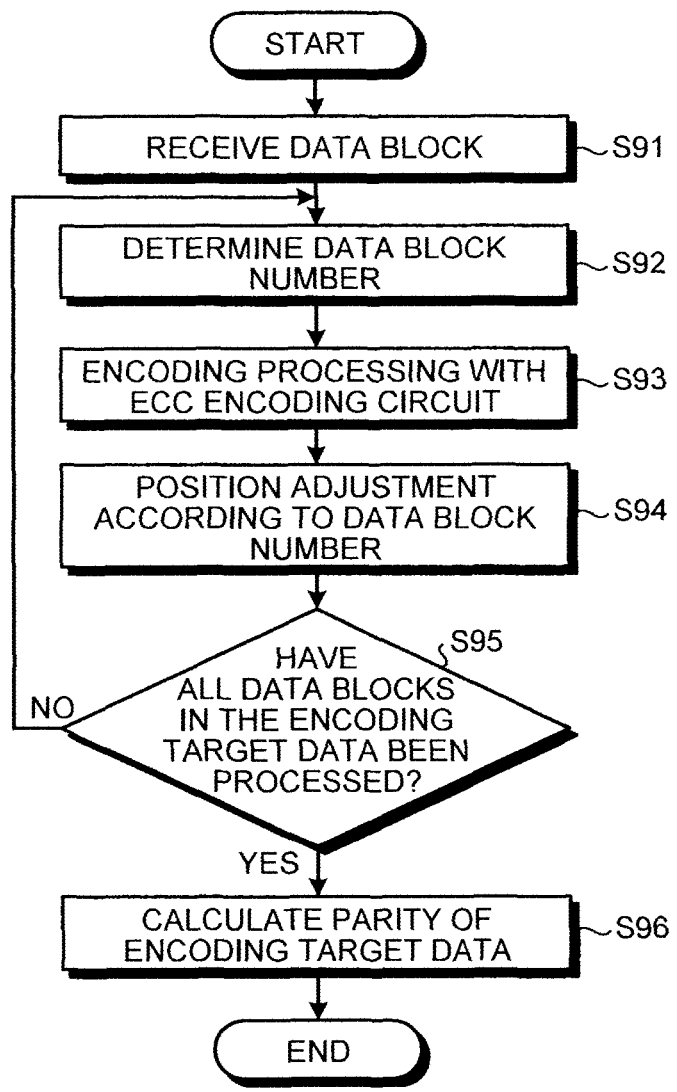
FIG. 37 is a figure illustrating an example of encoding processing procedure according to the eighth embodiment.

The example of configuration of FIG. 34 includes, for example, an s bit position adjusting circuit 88 capable of inputting s bits of "zeros" (in FIG. 33, 3 bits of "zeros") as illustrated in FIG. 33, a selector 87, and an FF 89. Then, when the control unit 3 performs control to input s bits of "zeros" into the s bit position adjusting circuit 88, input of "zeros" can be executed in units of s bits, for example, s bits, 2s bits, 3s bits, ..., in accordance with selection of the selector 87. The selector 87 selects the received intermediate result in the first repetition, so that s bits of "zero" are input. In the second and third times, the selector 87 selects the output of the FF 89. Therefore, in the second repetition, 2s bits can be input, and in the third repetition, 3s bits of "zeros" can be input. FIGS. 33, 37 are merely examples, and the configuration of the position adjusting circuit 82 is not limited thereto.

As described above, in the present embodiment, the ECC encoding processing circuit 81 for performing the encoding processing using some of data in the encoding target data, and the position adjusting circuit 82 for generating a parity of which bit position has been adjusted on the basis of a parity generated by the ECC encoding processing circuit 81 are provided. Therefore, using the parity of which bit position has been adjusted, the decoding can be performed on the basis of the assumption that the entire encoding target data are encoded. Therefore, the input order of data into the encoding device becomes more flexible. For example, the speed of the computation can be improved, and the buffer can be reduced.

Eighth Embodiment

Figure 35:
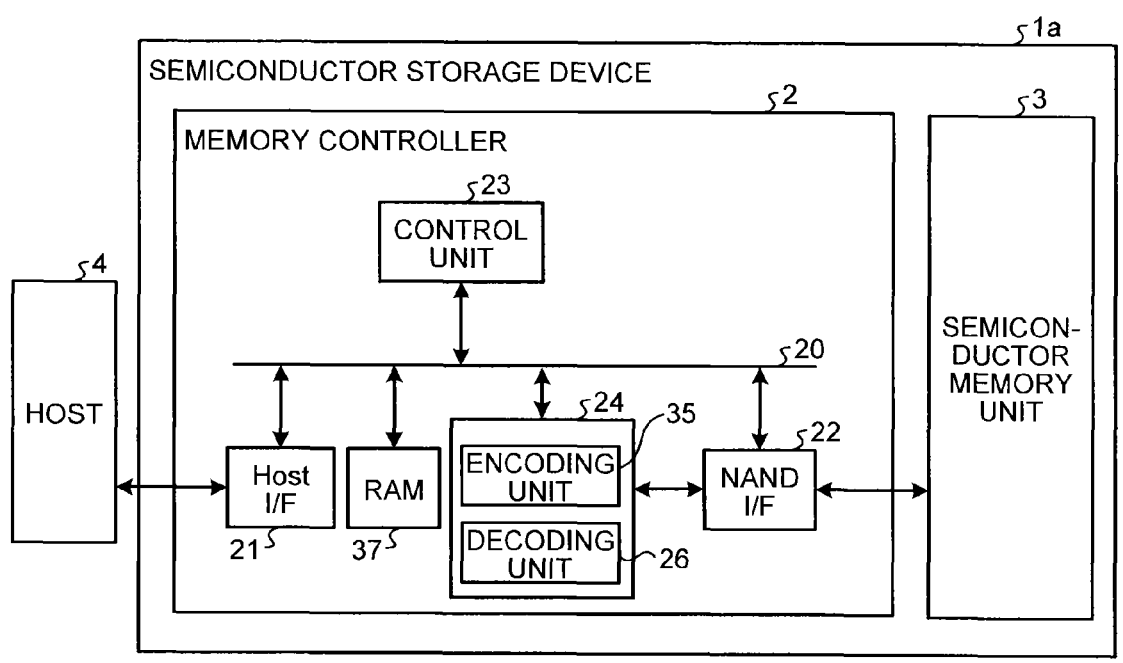
FIG. 35 is a block diagram illustrating an example of configuration of a storage device according to an eighth embodiment.

FIG. 35 is a block diagram illustrating an example of configuration of a semiconductor storage device 1a according to an eighth embodiment. The semiconductor storage device 1a according to the present embodiment is the same as the semiconductor storage device 1 according to the first embodiment except that a RAM (Random Access Memory) 37 is added to the semiconductor storage device 1 according to the first embodiment, and an encoding unit 35 is provided instead of the encoding unit 25.

The RAM 37 temporarily holds data received from the host 4 and data transmitted to the host 4.

In the present embodiment, the data received from the host 4 are encoded and written to the semiconductor memory unit 3, and the encoding target data include NB+1 data blocks as illustrated in FIG. 29 of the seventh embodiment. The decoding unit 26 performs decoding processing on the basis of the assumption that data are input in accordance with the input order of the data blocks defined in advance in units of encoding target data.

The data received from the host 4 are temporarily stored to the RAM 37. The control unit 23 manages correspondence, of the data received from the host 4 (hereinafter referred to as host data), between a logical address and an address on the semiconductor memory unit 23, and determines which host data constitute the encoding target data. The control unit 23 also manages whether an identification number of a data block in the encoding target data (for example, a number of a data block of the data block #i (i=1, 2, ..., NB) is denoted as i) is stored to the RAM 37. The control unit 23 controls the encoding unit 35 in accordance with the number of a data block stored to the RAM 37.

Even when the decoding processing is performed in the input order of data blocks determined in advance, the input order of data blocks can be set freely if the encoding device explained in the seventh embodiment is used as the encoding unit 35. For example, the encoding device as illustrated in FIG. 28 processes data blocks in any given order, and holds parity of each block of which position has been adjusted. When the parities of the NB+1 data blocks, equivalent to the encoding target data, of which positions have been adjusted, an exclusive OR of the parities is obtained, and thus, the ultimate parity can be generated. On the other hand, in the seventh embodiment, the position of the bit where information about the encoding target data exists is configured to be changeable without being fixed, but when the divisions of the data blocks are already known as illustrated in FIG. 29, the speed of the processing can be improved by providing a position adjusting circuit corresponding to each data block. In the explanation about the present embodiment, for example, a position adjusting circuit is provided for each data block.

Figure 36:
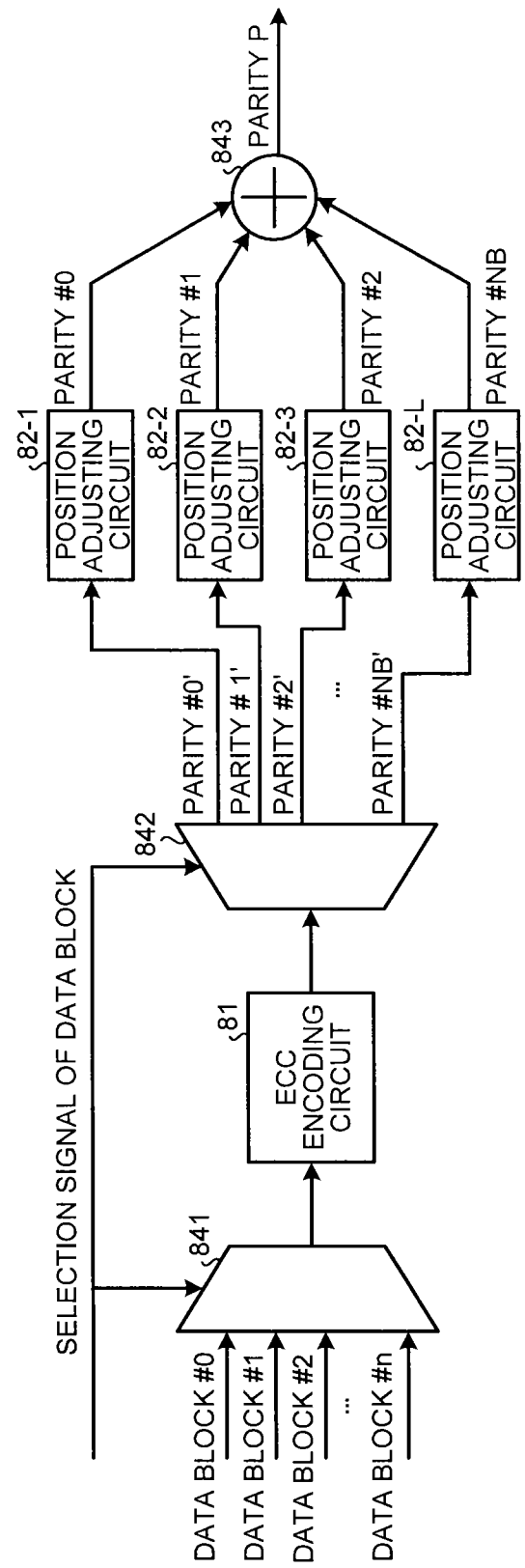
FIG. 36 is a figure illustrating an example of configuration of an encoding unit according to the eighth embodiment.

FIG. 36 is a figure illustrating an example of configuration of the encoding unit 35 according to the present embodiment. As illustrated in FIG. 36, the encoding unit 35 according to the present embodiment includes a selector 841, an ECC encoding circuit 81, position adjusting circuits (position adjusting units, position adjusting modules) 82-1 to 82-L (L=NB+1), and an adding device 843. The ECC encoding circuit 81 is the same as the ECC encoding circuit 81 of the seventh embodiment. The position adjusting circuits 82-1 to 82-L are the same as the first position adjusting circuit 82, but the number of bits to which zeros are input may not be changeable, and the position adjusting circuits 82-1 to 82-L may be configured to have a fixed number of "zeros" which are input thereto. In the example of configuration of FIG. 36, L is NB+2, and the circuits correspond to the following data blocks. The position adjusting circuit 82-1 corresponds to the data block #0, the position adjusting circuit 82-2 corresponds to the data block #1, . . . , and the position adjusting circuit 82-L corresponds to the data block # (LB+1). Therefore, for example, the position adjusting circuit 82-1 may be able to adjust the bit position corresponding to the data block #0, and the position adjusting circuit 82-2 may be able to adjust the bit position corresponding to the data block #1.

Subsequently, encoding processing according to the present embodiment will be explained. FIG. 37 is a figure illustrating an example of encoding processing procedure according to the present embodiment. FIG. 37 illustrates processing for generating a parity of one piece of encoding target data. First, when the control unit 23 receives a write request via host I/F 21 from the host 4, an address of data constituting encoding target data is allocated on the basis of an address of host data of write target.

For example, transmission from the host is performed in predetermined first data units, the predetermined data unit is further made in a plurality of second data units, and actual data transfer is assumed to be performed in the second data units. Then, the transfer of data from the host is managed in the first data units, and in the first data units, the data are received by the RAM 37 in the order of transmission from the host 4. Within the first data units, the order in the second data units in which the data are received by the RAM 37 is not guaranteed to be the order of transmission. For example, when host data in three pieces of first data units, i.e., host data #1, host data #2, host data #3, are transmitted from the host 4 in the following order: host data #1, host data #2, host data #3, then the host data are received by the RAM 37 in the following order: host data #1, host data #2, and then host data #3. On the other hand, for example, when host data #1 includes host data #1-1 to host data #1-5 which are five pieces of second data units, and the host data #1 are transmitted from the host in the following order: host data #1-1, host data #1-2, . . . , host data #1-5, then the order of reception may be changed such that host data #1-3 is received before host data #1-1 is received.

In this case, the order of reception does not change in first data units, but even when the order of reception changes in first data units, the same encoding processing can be executed if the RAM 37 has enough capacity to store a plurality of first data units.

In this case, for the sake of simplicity, the first data unit is the encoding target data of FIG. 29, and the second data unit is the data block of FIG. 29. The first data unit may be different from the encoding target data, and for example, the encoding target data may be made of a plurality of first data units. For example, when the encoding target data are made of two first data units, and the first data unit is made of five second data units (which will be denoted as data blocks), the encoding target data is made of ten data blocks. The operation in this case is the same as the case where one first data unit constitutes the encoding target data except that the number of data blocks is different. Although the management of reception of the data blocks becomes complicated, the second data unit may be different from the data block.

Back to the explanation of FIG. 37, when the control unit 23 recognizes that a data block (=first data unit) is received (a data block is stored to the RAM 37) (step S91), the control unit 23 finds the data block number of the data block (step S92). The data block number may be notified to the control unit 23 by causing the host I/F 21 to look up identification information (an address of data and the like) for identifying the data block number stored in the host data, or the control unit 23 may directly extract identification information of the host data to find the data block number.

The control unit 23 selects a data block of an encoding processing target, on the basis of the received data block number, transmits a selection signal of the data block to the encoding unit 35, and instructs the encoding unit 35 to start the encoding processing, so that the ECC encoding circuit 81 executes the encoding processing (step S93). At this occasion, the selector 841 selects an input data block on the basis of the selection signal given by the control unit 23 and inputs the input data block into the ECC encoding circuit 81. The selector 842 outputs a parity (intermediate result) generated by the ECC encoding circuit 81 into the position adjusting circuit (any one of position adjusting circuits 82-1 to 82-L) selected on the basis of the selection signal. Hereinafter, the parity which is the intermediate result corresponding to the data block #i is denoted as a parity #i'.

The position adjustment 82-i receiving the parity #i' executes position adjustment explained in the seventh embodiment, on the basis of the position in the encoding target data of the data block #i, and generates the parity #i (step S94). Thereafter, the control unit 23 determines whether all the data blocks in the encoding target data have been processed or not (parities have been generated or not) (step S95). When all the data blocks in the encoding target data are determined not to have been processed yet (step S95, No), step S92 is subsequently performed.

When all the data blocks in the encoding target data are determined to have been processed (step S95, Yes), the adding device 43 calculates an exclusive OR of parities #0 to #L as a parity P of the encoding target data (step S96), and the processing is terminated.

The parity P as well as the encoding target data are written to the semiconductor memory unit 3. During read operation from the semiconductor memory unit 3, the encoding target data and the parity P are read and decoded by the decoding unit 26, and the decoded data are transmitted to the host 4.

In this case, the parity P is sought after all the data blocks of the encoding target data have been obtained, but when it is known that only some data blocks of the encoding target data can be received, the parity P may be sought by calculating an exclusive OR of parities of some data blocks of which positions have been adjusted. For example, when all the data blocks of the encoding target cannot be obtained even after a predetermined period of time passes since the last data block of the encoding target has been received, non-received data blocks may be determined to have been lost in the way, and the parity p may be sought using only the received data blocks.

An example of configuration of the position adjusting circuits 82-1 to 82-L will be explained. In this case, an example will be explained in which the size of a data block is one bit, NB is 3 (the number of data blocks constituting one piece of encoding target data is 4), L is 4, and four position adjusting circuits are provided. The parity has 3 bits, and the values of the bits of the parity (intermediate result) generated by the ECC encoding generating circuit 81 are r[0], r[1], r[2].

Figure 38:
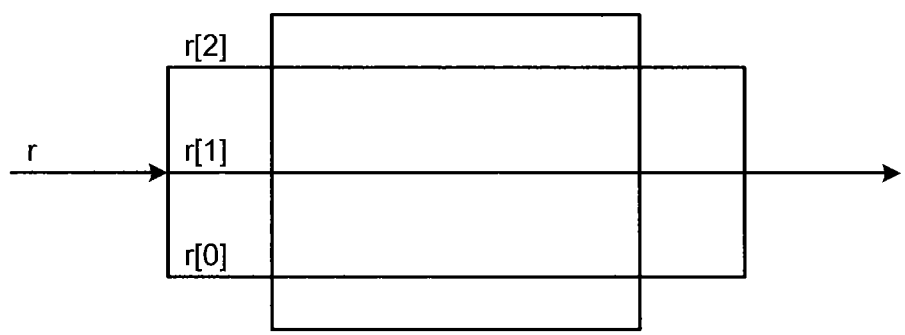
FIG. 38 is a figure illustrating an example of configuration of a position adjusting circuit.
Figure 39:
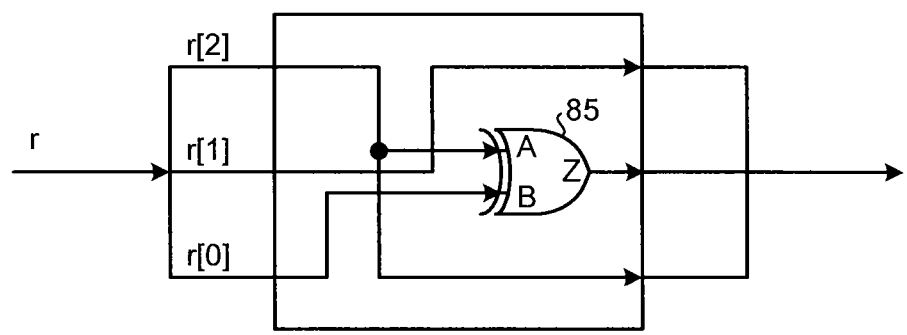
FIG. 39 is a figure illustrating an example of configuration of a position adjusting circuit.
Figure 40:
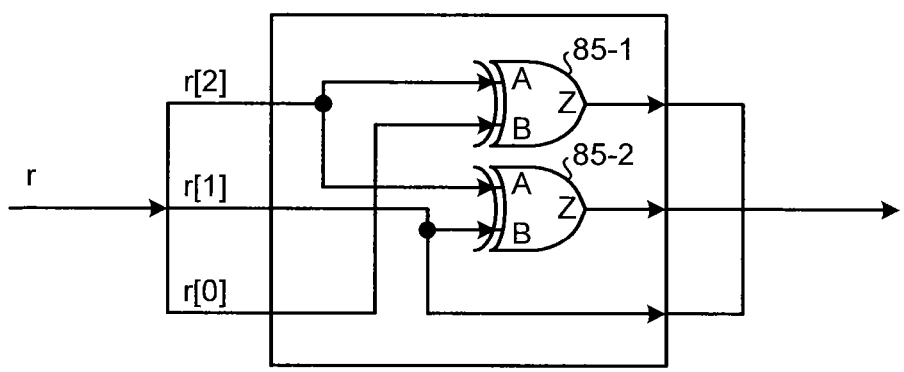
FIG. 40 is a figure illustrating an example of configuration of a position adjusting circuit.
Figure 41:
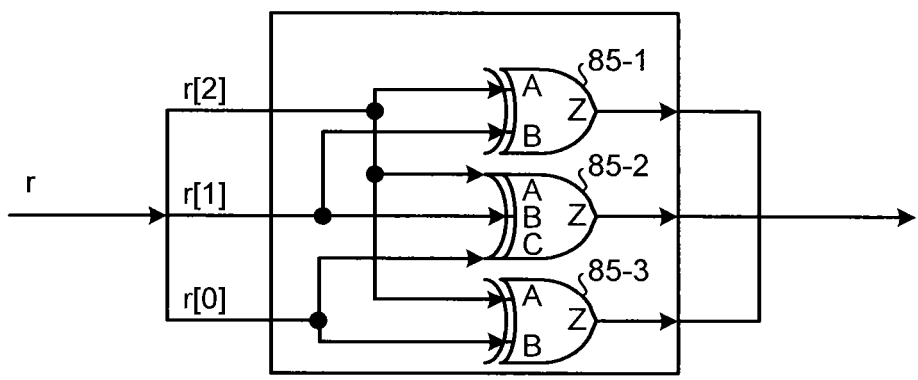
FIG. 41 is a figure illustrating an example of configuration of a position adjusting circuit.

FIGS. 38 to 41 are figures illustrating examples of configurations of position adjusting circuits 82-1 to 82-4. FIG. 38 is an example of configuration of the position adjustment 82-1. FIG. 39 is an example of configuration of the position adjusting circuit 82-2. FIG. 40 is an example of configuration of the position adjusting circuit 82-3. FIG. 41 is an example of configuration of the position adjusting circuit 82-4. FIG. 42 is a figure illustrating an example of an input intermediate result (parity #i') and an output parity #i in a case where the configurations of FIGS. 38 to 41 are used.

When the encoding target data include (d3 d2 d3 d0), zeros are input as follows in each data block, so that the positions are adjusted.

| (1) | Data block | #0 | ( |    |    | d0) |
|-----|------------|----|----|----|----|-----|
| (2) | Data block | #1 | (  |    | d1 | 0)  |
| (3) | Data block | #2 | (  | d2 | 0  | 0)  |
| (4) | Data block | #3 | (d3| 0  | 0  | 0)  |

The position adjusting circuit 82-1 corresponding to the data block #0 need not input any zero as illustrated in FIG. 38, and therefore, outputs r[0], r[1], r[2] without any change. As illustrated in FIG. 39, the position adjusting circuit 82-2 corresponding to the data block #1 includes an XOR gate 85. As processing for inputting one "zero", the position adjusting circuit 82-2 outputs r[2] as output bit #0 (corresponding to output of r[0] where the position adjustment is not performed), outputs r[0]^r[2] as output bit #1 (corresponding to output of r[1] where the position adjustment is not performed), and outputs r[0] as output bit #2 (corresponding to output of r[2] where the position adjustment is not performed). ^ denotes exclusive OR computation.

As illustrated in FIG. 40, the position adjusting circuit 82-3 corresponding to the data block #2 includes XOR gates 85-1, 85-2. As processing for inputting two "zeros", the position adjusting circuit 82-3 outputs r[1] as output bit #0, outputs r[2]^r[1] as output bit #1, and outputs r[1] as output bit #2.

As illustrated in FIG. 41, the position adjusting circuit 82-4 corresponding to the data block #3 includes XOR gates 85-1, 85-2, 85-3. As processing for inputting three "zeros", the position adjusting circuit 82-4 outputs r[0]^r[2] as output bit #0, outputs r[0]^r[2]^r[1] as output bit #1, and outputs r[2]^r[1] as output bit #2.

Figures 44, 45:
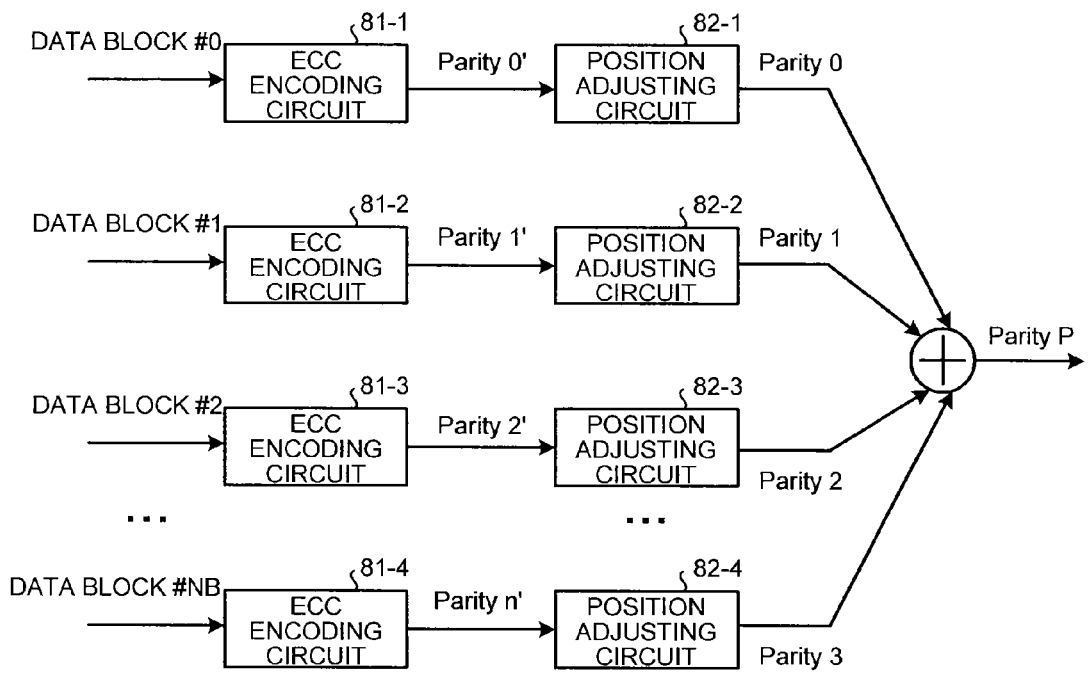
FIG. 44 is a figure illustrating a specific example of an intermediate result (parity #i') and a position-adjusted parity (parity #i) in a case where the information of FIG. 43 is input.
FIG. 45 is a figure illustrating an example of configuration of an encoding unit according to a ninth embodiment.

FIG. 43 is a figure illustrating an example of input information and "zero" input. FIG. 44 is a figure illustrating a specific example of an intermediate result (parity #i') and a position-adjusted parity (parity #i) in a case where the information of FIG. 43 is input. When the information is 1101 (d3=1: d2=1: d1=0: d0=1) as shown in the left field of FIG. 43. As shown in the right field of FIG. 43, "zeros" are input according to the data blocks.

As illustrated in FIG. 44, in the data block #0, parity # (Parity) 0' generated by the ECC encoding circuit 81 is {r[2], r[1], r[0]}={0, 1, 1}. In the data block #1, the parity #1' generated by the ECC encoding circuit 81 is {r[2], r[1], r[0]}={0, 1, 1}. In the data block #2, the parity #2' generated by the ECC encoding circuit 81 is {r[2], r[1], r[0]}={0, 0, 0}. In the data block #3, the parity #3' generated by the ECC encoding circuit 81 is {r[2], r[1], r[0]}={0, 1, 1}.

With the processing explained using FIG. 42, the parity #0 becomes {1, 0, 0}, the parity #1 becomes {1, 1, 1}, the parity #2 becomes {0, 0, 0}, and the parity #3 becomes {0, 1, 1}. The ultimately obtained parity P is {0, 0, 1}. Therefore, the parity P for the information 1101 is 001, and the code word is 1101001.

In this example, each data block size is the same. Alternatively, the data size of each data block may be different.

As described above, in the present embodiment, the position adjusting circuit is provided for each data block, so that the position adjustment processing can be executed in parallel. Therefore, the position of the encoding target data where the encoding is started may be set at any position in units of data blocks, and the configuration of the position adjusting circuit can be simplified. Even when the order of reception of the data blocks is different from the predetermined order, the encoding processing can be executed in the order of reception. In addition, the amount of buffer can be reduced, and the speed of the processing can be improved.

Ninth Embodiment

FIG. 45 is a figure illustrating an example of configuration of an encoding unit 35*a* according to a ninth embodiment. The encoding unit 35*a* according to the present embodiment is used instead of an encoding unit 35 in a semiconductor storage device 1*a* explained in the eighth embodiment. Constituent elements having the same functions as those of the eighth embodiment are denoted with the same reference numerals as those of the eighth embodiment, and repeated description thereabout is omitted.

The encoding unit 35*a* is the same as the encoding unit 35 according to the eighth embodiment except that the selectors 841, 842 are removed from the encoding unit 35 according to the eighth embodiment, and ECC encoding circuits 81-1 to 81-L are provided instead of the ECC encoding circuit 81. In the eighth embodiment, the ECC encoding circuit 81 is shared by the data blocks, but in the present embodiment, as many ECC encoding circuits 81-1 to 81-L as the number of data blocks are provided, and encoding processing of each data block is executed by a different ECC encoding circuit. Therefore, the encoding processing can be executed in parallel, and as compared with the eighth embodiment, the speed of the processing can be improved. As described above, the operation of the present embodiment is the same as the eighth embodiment.

For example, when the data size of each data block is the same, the time it takes to perform the encoding processing is 1/L of the encoding device according to the comparative example. As described above, in the present embodiment, the same effects as those of the eighth embodiment can be obtained. In addition, the encoding processing can be made into parallel, and the speed of the encoding processing can be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A storage device comprising:
   a memory unit;
   an encoder generating an error detection code word on the basis of data written to the memory unit, and generating an error correction code on the basis of the data and the error detection code word to the data;
   a memory control unit writing the data, the error detection code word, and the error correction code to the memory unit, and reading the data written in the memory unit and the error detection code word and the error correction code to the data; and
   a decoder decoding a code including the data read from the memory unit and the error detection code word and the error correction code to the data, wherein the decoder includes:
an error correction processor performing, on the basis of the error detection code word, error correction processing to correct an error number, which is less than a maximum correctable error number of the error correction code, of an error;
an error detector detecting an error of the error-corrected data, on the basis of the error detection code word and the data corrected by the error correction processing; and
a decoding controller controlling to repeat a cycle, which includes the error correction processing and the detecting the error of the error-corrected data, for a same error detection code word until the error detector no longer detects any error or when a target error number of the error correction processing becomes the maximum correctable error number by the error correction code, and increasing the target error number of the error correction processing each cycle,
wherein the error correction processing uses information obtained during the error correction processing in a previous cycle.

2. The storage device according to claim 1, wherein the error correction processor calculates a syndrome using N or less calculating devices (N is an integer equal to or more than 1 and less than 2×T (T is the maximum correctable error number by the error correction code)),
performs error locator polynomial calculation using M calculating devices (M is an integer equal to or more than 1 and less than T) on the basis of the error detection code word and the syndrome, and
obtains an error position of the data using L calculating devices (L is an integer equal to or more than 1 and less than T) on the basis of a result of the error locator polynomial calculation.

3. The storage device according to claim 2, wherein when the error locator polynomial calculation is determined not to be terminated normally, processing of subsequent cycle is executed without executing the remaining processing of the cycle currently executed.

4. The storage device according to claim 2, wherein when the obtained error position is not a position to the error detection code word, processing of subsequent cycle is executed without executing the remaining processing of the cycle currently executed.

5. The storage device according to claim 2, wherein when a number of solutions calculated in the error locator polynomial calculation is different from a number of error positions thus sought, processing of subsequent cycle is executed without executing the remaining processing of the cycle currently executed.

6. The storage device according to claim 2, wherein a calculated syndrome is stored to a syndrome storage unit, and in second and subsequent syndrome calculations to the same data, the syndrome stored in the syndrome storage unit is used.

7. The storage device according to claim 2, wherein in the error locator polynomial calculation, information usable in a subsequent cycle which is obtained in the process of calculation is stored to the memory unit as reuse information, and in second and subsequent error locator polynomial calculations to the same data, the error locator polynomial calculation is performed using the reuse information stored in the memory unit.

8. A storage device comprising:
an encoder generating a code word by executing error correction encoding processing;
a memory unit storing the code word;
a syndrome calculator calculating a syndrome on the basis of the code word read from the memory unit;
an error locator polynomial calculator performing error locator polynomial calculation on the basis of the syndrome;
a Chien search unit performing Chien search on the basis of a coefficient of a term in an error locator polynomial calculated by the error locator polynomial calculation; and
a decoding controller performing error correction on the basis of a result of the Chien search,
wherein the Chien search unit includes:
L calculating devices (L is an integer equal to or more than one); and
an adding device adding a calculation result provided by the calculating device, calculating device
wherein the i-th calculating device of the L calculating devices includes:
a first register;
a first multiplying device inputting a result, which is obtained by multiplying input data by $\alpha^i$, to the adder as a calculation result, and updating a content of the first register with the calculation result;
a second multiplying device multiplying input data by $\alpha^K$ (K is a constant integer, which has no relation to i, equal to or more than one);
a first selector selecting any one of a content of the first register and a calculation result provided by a second multiplying device, and inputting the selected one into the first multiplying device; and
a second selector selecting any one of the content of the first register and the calculation result provided by the second multiplying device, and inputting the selected one into the second multiplying device.

9. The storage device according to claim 8 further comprising a second register holding a result of addition provided by the adder,
wherein the i-th calculation device of the L calculating devices further includes a third register for holding a calculation result provided by the second multiplying device,
wherein the first register stores the coefficient, and when the second register holds the result of addition, the adder adds the held result of addition and the calculation result provided by the calculation device.

10. The storage device according to claim 9, wherein K is L.

11. The storage device according to claim 10, wherein when a number of error bits obtained from the error locator polynomial calculation is equal to or less than L, the first selector selects the content of the first register.

12. The storage device according to claim 11, wherein when the number of error bits obtained from the error locator polynomial calculation is more than L and equal to or less than 2×L, the second selector selects the content of the first register, and the first selector selects the calculation result provided by the second multiplying device.

13. The storage device according to claim 12, wherein when the number of error bits obtained from the error locator polynomial calculation is more than 2×L, the second selector selects the content of the first register, and the first selector selects the calculation result provided by the second multiplying device, and thereafter the second selector selects the calculation result held in the third register and the first selector selects the calculation result provided by the second multiplying device, which are repeated until calculations to the number of error bits are finished.

14. The storage device according to claim 9 comprising:
a first calculation unit including L calculating devices, the adder, and the second register;
a second calculation unit including L calculating device, the adder, and the second register; and
an adding unit adding a first result of addition which is output from the adder of the first calculation unit and a second result of addition which is output from the adder of the second calculation unit,
wherein the calculating device of the second calculation unit further includes:
an initial value calculator calculating an initial value for performing calculation in which a search region different from that of the first calculation unit; and
a third selector for selecting any one of the coefficient and the initial value, and inputting the selected one into the first register,
wherein the third selector selects the coefficient or the initial value in accordance with the number of error bits obtained from the error locator polynomial calculation.

15. The storage device according to claim 8, wherein the Chien search unit includes:
a first calculation unit including:
L first calculating devices (I, is an integer equal to or more than one); and
a first adder adding calculation results provided by the first calculating devices,
a second calculation unit including:
second calculating devices which are L calculating devices (L is an integer equal to or more than one); and
a second adder adding calculation results provided by the second calculating devices,
an adding unit adding a result of addition provided by first adder and a result of addition provided by second adder, in accordance with the number of error bits obtained from the error locator polynomial calculation
wherein the i-th calculating device of the first calculation unit and the second calculation unit includes the first register and the first multiplying device,
the first register of the first calculation unit inputs the coefficient as an initial value, and the first calculation unit inputs a content of the first register,
wherein the second calculating device further includes:
an initial value calculator calculating an initial value for performing calculation in which a search region different from that of the first calculation unit;
a first selector selecting any one of the coefficient and the initial value, and inputting the selected one into the register; and
a second selector selecting any one of the content of the register and the calculation result provided by the second multiplying device, and inputting the selected one into the first multiplying device,
wherein data which are input into the second multiplying device are data which are input from the register,
and the first selector selects the coefficient or the initial value in accordance with the number of error bits obtained from the error locator polynomial calculation.

16. The storage device according to claim 15 comprising a plurality of second calculation units,
wherein K is n×L (n is an integer equal to or more than one), and n is a different value for each second calculation unit.

17. The storage device according to claim 15, wherein when the number of error bits obtained from the error locator polynomial calculation is equal to or less than L, the first selector selects the coefficient,
and when the number of error bits obtained from the error locator polynomial calculation is more than L, the first selector selects the initial value, and the adding unit adds the first result of addition which is output from the adder of the first calculation unit and the second result of addition which is output from the adder of the second calculation unit.

18. A storage device comprising:
a memory unit;
an encoder generating a code word by performing encoding processing in which data having a predetermined data length stored in the memory unit are adopted as encoding data; and
a decoder performing decoding processing on the basis of a code read from the memory unit,
wherein the encoder includes:
an encoder performing encoding processing on L data blocks (L is an integer equal to or more than two) constituting the encoding data which is a basis for one code word; and
L position adjusters generating, for each data block, a parity according to a bit position of the data block in the encoding data which is a basis for one code word, on the basis of a parity generated by the encoding processing, and setting 0 for bits of the encoding block except for a bit of the bit position of the data block.

19. The storage device according to claim 18, wherein the encoder is provided for each data block, and the encoding processing is executed for each data block in parallel.

20. A storage device comprising:
an encoder generating an error detection code and an error correction code, and generating a code word including the error detection code and the error correction code;
an error correction processor performing, on the basis of the error correction code, error correction processing with a second correctable error amount, which is less than a first correctable error amount of the error correction code;
an error detector performing a first processing for detecting an error of the error-corrected data, on the basis of the error detection code and the data corrected by the error correction processing;
a controller performing a second processing for varying a correctable error amount of the error correction processing, to become closer to the first error correctable amount, between the first correctable error amount and the second correctable error amount by controlling a number of the error correction processing for a same code word; and
a decoding controller repeating the first processing and the second processing until the error detector no longer detects any error or until a target error number of the error correction processing equals the first correctable error amount.

* * * * *

UNITED STATES PATENT AND TRADEMARK OFFICE
CERTIFICATE OF CORRECTION

PATENT NO. : 8,640,013 B2  
APPLICATION NO. : 13/601707  
DATED : January 28, 2014  
INVENTOR(S) : Toshikatsu Hida et al.

Page 1 of 1

It is certified that error appears in the above-identified patent and that said Letters Patent is hereby corrected as shown below:

On the title page, Item (30), the Foreign Application Priority Data Information is incorrect. Item (30) should read:

--(30) Foreign Application Priority Data

| | | |
|---|---|---|
| Sep. 22, 2011 | (JP) | ............................2011-208038 |
| Mar. 23, 2012 | (JP) | ............................2012-066964 |
| Mar. 23, 2012 | (JP) | ............................2012-067056 |
| Mar. 23, 2012 | (JP) | ............................2012-067276-- |

Signed and Sealed this  
Fifteenth Day of April, 2014

Michelle K. Lee  
*Deputy Director of the United States Patent and Trademark Office*